US012640537B2

(12) United States Patent
Ishii

(10) Patent No.: US 12,640,537 B2
(45) Date of Patent: May 26, 2026

(54) OPTICAL DEVICE AND OPTICAL TRANSMITTER

(71) Applicant: FUJITSU OPTICAL COMPONENTS LIMITED, Kawasaki (JP)

(72) Inventor: Toshio Ishii, Yokohama (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 579 days.

(21) Appl. No.: 18/200,936

(22) Filed: May 23, 2023

(65) Prior Publication Data

US 2024/0006846 A1    Jan. 4, 2024

(30) Foreign Application Priority Data

Jun. 29, 2022    (JP) ................................. 2022-104936

(51) Int. Cl.
| | |
|---|---|
| *H01S 5/0683* | (2006.01) |
| *H01S 5/04* | (2006.01) |
| *H01S 5/06* | (2006.01) |
| *H01S 5/062* | (2006.01) |
| *H04B 10/54* | (2013.01) |

(52) U.S. Cl.
CPC .......... *H01S 5/06832* (2013.01); *H01S 5/041* (2013.01); *H01S 5/0617* (2013.01); *H01S 5/062* (2013.01); *H04B 10/54* (2013.01)

(58) Field of Classification Search
CPC .... H01S 5/06832; H01S 5/041; H01S 5/0617; H01S 5/062; H04B 10/54
USPC ........................................................ 359/344
See application file for complete search history.

(56) References Cited

U.S. PATENT DOCUMENTS

| | | | |
|---|---|---|---|
| 7,149,256 B2 * | 12/2006 | Vrazel ................ | H04L 25/4917 398/189 |
| 2002/0080447 A1 * | 6/2002 | Fells .................. | H04B 10/2935 398/178 |
| 2020/0033642 A1 * | 1/2020 | Komatsu ............... | H04B 10/54 |
| 2020/0336212 A1 | 10/2020 | Yu et al. | |
| 2021/0273407 A1 | 9/2021 | Kurita et al. | |

FOREIGN PATENT DOCUMENTS

| | | |
|---|---|---|
| JP | 2015-198269 A | 11/2015 |
| JP | 2016-9897 A | 1/2016 |
| JP | 2020-53423 A | 4/2020 |

* cited by examiner

*Primary Examiner* — Daniel A Hess
(74) *Attorney, Agent, or Firm* — STAAS & HALSEY LLP

(57) ABSTRACT

An optical device includes a generator, a light emitter, a modulator, an optical amplifier, a current source, a storage, and a controller. The generator generates an electric signal of a multilevel amplitude modulation method. The light emitter emits laser light. The modulator modulates the laser light using the electric signal and outputs an optical signal. The optical amplifier optically amplifies the modulated optical signal according to a drive current. The current source adjusts the drive current to be supplied to the optical amplifier. The storage previously stores an information with respect to input-output characteristics of the optical signal in the optical amplifier relative to drive current value of the drive current. The controller acquires, from the storage, the input-output characteristics corresponding to the drive current value of the drive current supplied to the optical amplifier and controls the electric signal based on the acquired input-output characteristics.

10 Claims, 24 Drawing Sheets

FIG.3

SOA DRIVE CURRENT $I_{SOA}$ [mA]

| OPTICAL INPUT POWER $P_{in}$ [mW] | 20 | 25 | 30 | 35 | 40 | 45 | 50 | ... |
|---|---|---|---|---|---|---|---|---|
| 0 | $P_{out}(0, 20)$ | $P_{out}(0, 25)$ | $P_{out}(0, 30)$ | $P_{out}(0, 35)$ | $P_{out}(0, 40)$ | $P_{out}(0, 45)$ | $P_{out}(0, 50)$ | ... |
| 1 | $P_{out}(1, 20)$ | $P_{out}(1, 25)$ | $P_{out}(1, 30)$ | $P_{out}(1, 35)$ | $P_{out}(1, 40)$ | $P_{out}(1, 45)$ | $P_{out}(1, 50)$ | ... |
| 2 | $P_{out}(2, 20)$ | $P_{out}(2, 25)$ | $P_{out}(2, 30)$ | $P_{out}(2, 35)$ | $P_{out}(2, 40)$ | $P_{out}(2, 45)$ | $P_{out}(2, 50)$ | ... |
| 3 | $P_{out}(3, 20)$ | $P_{out}(3, 25)$ | $P_{out}(3, 30)$ | $P_{out}(3, 35)$ | $P_{out}(3, 40)$ | $P_{out}(3, 45)$ | $P_{out}(3, 50)$ | ... |
| 4 | $P_{out}(4, 20)$ | $P_{out}(4, 25)$ | $P_{out}(4, 30)$ | $P_{out}(4, 35)$ | $P_{out}(4, 40)$ | $P_{out}(4, 45)$ | $P_{out}(4, 50)$ | ... |
| 5 | $P_{out}(5, 20)$ | $P_{out}(5, 25)$ | $P_{out}(5, 30)$ | $P_{out}(5, 35)$ | $P_{out}(5, 40)$ | $P_{out}(5, 45)$ | $P_{out}(5, 50)$ | ... |
| 6 | $P_{out}(6, 20)$ | $P_{out}(6, 25)$ | $P_{out}(6, 30)$ | $P_{out}(6, 35)$ | $P_{out}(6, 40)$ | $P_{out}(6, 45)$ | $P_{out}(6, 50)$ | ... |
| 7 | $P_{out}(7, 20)$ | $P_{out}(7, 25)$ | $P_{out}(7, 30)$ | $P_{out}(7, 35)$ | $P_{out}(7, 40)$ | $P_{out}(7, 45)$ | $P_{out}(7, 50)$ | ... |
| 8 | $P_{out}(8, 20)$ | $P_{out}(8, 25)$ | $P_{out}(8, 30)$ | $P_{out}(8, 35)$ | $P_{out}(8, 40)$ | $P_{out}(8, 45)$ | $P_{out}(8, 50)$ | ... |
| ... | ... | ... | ... | ... | ... | ... | ... | ... |
| 20 | $P_{out}(20, 20)$ | $P_{out}(20, 25)$ | $P_{out}(20, 26)$ | $P_{out}(20, 27)$ | $P_{out}(20, 28)$ | $P_{out}(20, 29)$ | $P_{out}(20, 30)$ | ... |

OPTICAL OUTPUT POWER Pout $(P_{in}, I_{SOA})$
SELECT ONE COLUMN BASED ON SOA
DRIVE CURRENT MONITOR VALUE

GAIN CURVE BEFORE POWER COMPENSATION

LINEAR AREA BEFORE POWER COMPENSATION

GAIN CURVE AFTER POWER COMPENSATION

LINEAR AREA AFTER POWER COMPENSATION

GAIN CURVE BEFORE POWER COMPENSATION

LINEAR AREA BEFORE POWER COMPENSATION

GAIN CURVE AFTER POWER COMPENSATION

LINEAR AREA AFTER POWER COMPENSATION

*E.R.: EXTINCTION RATIO

FIG.16

_ _ _ _ _ GAIN CURVE BEFORE
POWER COMPENSATION

──── LINEAR AREA BEFORE
POWER COMPENSATION

_ _ _ _ _ GAIN CURVE AFTER
POWER COMPENSATION

──── LINEAR AREA AFTER
POWER COMPENSATION

GAIN CURVE BEFORE
POWER COMPENSATION

LINEAR AREA BEFORE
POWER COMPENSATION

------ GAIN CURVE AFTER
   POWER COMPENSATION

⸺ LINEAR AREA AFTER
   POWER COMPENSATION

-------- GAIN CURVE BEFORE
   POWER COMPENSATION

⸺⸺ LINEAR AREA BEFORE
   POWER COMPENSATION

OPTICAL DEVICE AND OPTICAL TRANSMITTER

CROSS-REFERENCE TO RELATED APPLICATION

This application is based upon and claims the benefit of priority of the prior Japanese Patent Application No. 2022-104936, filed on Jun. 29, 2022, the entire contents of which are incorporated herein by reference.

FIELD

The embodiments discussed herein are related to an optical device and an optical transmitter.

BACKGROUND

In association with an increase in the transmission speed, an increase in the modulation rate and a multilevel modulation format are adopted recently. For example, an optical transmitter exceeding 100 Gbps (Giga bit per second) per wave for a data center employs a modulation format of PAM4 (4 Pulse Amplitude Modulation). An optical transmitter of 100 Gbps (50 giga baud rate) per wave is used for short-distance transfer in which an optical signal is transferred with, for example, an optical transfer path of 500 meters and, in recent years, it is required to employ the optical transmitter for communication between data centers, for example, transfer in a long-distance of 40 kilometers.

For example, as for an NRZ (Non-Return-to Zero) optical transmitter of a 25 giga baud rate that is employed for transfer in a long distance of 40 kilometers, an avalanche Photodiode (APD) or a semiconductor optical amplifier (SOA) is installed in an optical receiver. The optical receiver includes a function of increasing the signal quality of optical signals, which ensures a loss budget that is allowable in the optical transfer path that transfers optical signals.

In an optical transmitter of 100 Gbps (50 giga baud rate) per wave, for example, when transfer of a long distance of 40 kilometers is used, an APD or a SOA can be installed in an optical receiver as in the case of the conventional NRZ optical transmitter. In the optical receiver corresponding to the optical transmitter of 100 Gbps (50 giga baud rate) per wave, however, it is not possible to ensure the same receiving sensitivity as that of the optical receiver corresponding to the NRZ optical transmitter due to the effect of the higher rate than that of the conventional NRZ optical transmitter and the multilevel modulation. It is thus the fact that, as for the optical transmitter of 100 Gbps per wave, even when the configuration of the optical receiver is changed, it is not possible to meet the requirements of loss budget as in the conventional NRZ optical transmitter.

Thus, when an optical transmitter exceeding 100 Gbps per wave and employing a multilevel amplitude modulation method is used for long-distance transfer, it has been proposed that the optical transmitter incorporates the SOA that optically amplifies an optical signal after being modulated by a modulator, thereby meeting the requirements of loss budget.

Patent Literature 1: Japanese Laid-open Patent Publication No. 2015-198269
Patent Literature 2: Japanese Laid-open Patent Publication No. 2016-9897
Patent Literature 3: US Patent Application Publication No. 2020/0336212

Patent Literature 4: Japanese Laid-open Patent Publication No. 2020-53423
Patent Literature 5: US Patent Application Publication No. 2021/0273407

In the optical transmitter incorporating the SOA and employing the multilevel amplitude modulation method, however, changes in optical coupling occurs between the SOA and optical components of an output stage of the SOA and changes in an optical output power of the SOA including changes in optical coupling occur and accordingly signal quality deteriorates.

SUMMARY

According to an aspect of an embodiment, an optical device includes a generator, a light emitter, a modulator, an optical amplifier, a current source, a storage and a controller. The generator generates an electric signal of a multilevel amplitude modulation method. The light emitter emits laser light. The modulator modulates the laser light using the electric signal and outputs an optical signal of the modulated laser light. The optical amplifier optically amplifies the modulated optical signal according to a drive current. The current source adjusts the drive current to be supplied to the optical amplifier. The storage previously stores an information with respect to input-output characteristics of the optical signal in the optical amplifier relative to drive current value of the drive current. The controller acquires, from the storage, the input-output characteristics corresponding to the drive current value of the drive current supplied to the optical amplifier and controls the electric signal based on the acquired input-output characteristics.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 is an explanatory table presenting an example of table content of a gain table;

FIG. 16 is an explanatory diagram illustrating an example of a configuration of an optical transmitter of a third embodiment;

DESCRIPTION OF EMBODIMENTS

First of all, an optical transmitter of a comparative example that incorporates a SOA and that cancels changes in optical output power including changes in optical coupling between the SOA and an optical component arranged at an output stage of the SOA will be described.

Comparative Example 1

Figure 19:
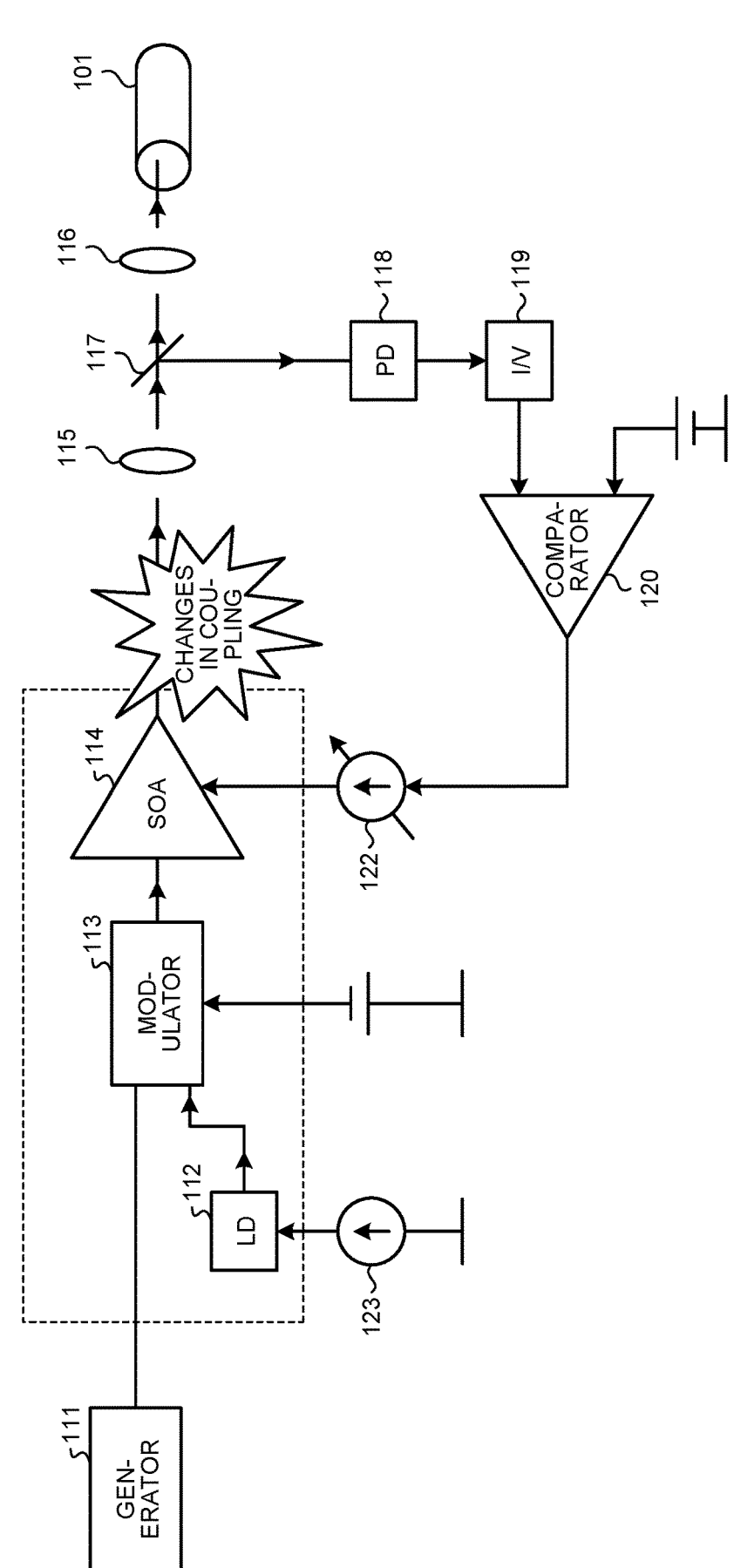
FIG. 19 is an explanatory diagram illustrating an example of a configuration of an optical transmitter of Comparative Example 1.

FIG. 19 is an explanatory diagram illustrating an example of a configuration of an optical transmitter 100 of Comparative Example 1. The optical transmitter 100 illustrated in FIG. 19 includes a generator 111, a laser diode (LD) 112, a modulator 113, a SOA 114, a first lens 115, a second lens 116, and a branching unit 117. The optical transmitter 100 further includes a photo diode (PD) 118, a voltage converter 119, a comparator 120, a changeable current source 122 and a fixed current source 123. In order to cancel changes in optical coupling that relate to optical components between the SOA 114 and an optical fiber 101, the optical transmitter 100 employs a SOA current feedback control system that adjusts a SOA drive current to be supplied to the SOA 114.

The generator 111 generates an electric signal according to a multilevel amplitude modulation method, for example, a PAM4 drive voltage. The LD 112 emits laser light. The modulator 113 is, for example, an electro-absorption (EA) modulator that modulates the laser light using the PAM4 drive voltage and outputs an optical signal. According to the SOA drive current from the changeable current source 122, the SOA 114 optically amplifies the optical signal that is modulated by the modulator 113. The first lens 115 is a lens that focuses the optical signal that is optically amplified by the SOA 114. The second lens 116 is a lens that focuses the optical signal that is focused by the first lens 115 on an optical waveguide in the optical fiber 101 and outputs the focused optical signal. The branching unit 117 is arranged between the first lens 115 and the second lens 116 and branches part of the optically-amplified optical signal that is focused by the first lens 115.

The PD 118 performs photoelectric conversion into a monitor current on the part of the optical signal that is branched by the branching unit 117. The voltage converter 119 converts the monitor current, which is obtained by the PD 118 by performing the photoelectric conversion, into a monitor voltage. The comparator 120 compares a monitor voltage value corresponding to the monitor voltage, which is obtained by the voltage converter 119 by performing the conversion, and a target voltage value and sets a difference signal that is the result of the comparison in the changeable current source 122. Note that the target voltage value is a voltage value corresponding to the target current value of an optical output power of the optical signal of the SOA 114.

The changeable current source 122 is a current source that adjusts the SOA drive current to be supplied to the SOA 114 in a direction in which changes in the optical output power including changes in optical coupling at an output stage of the SOA 114 are canceled according to the difference signal. The fixed current source 123 is a current source that supplies a fixed LD drive current to be supplied to the LD 112.

Figure 20:
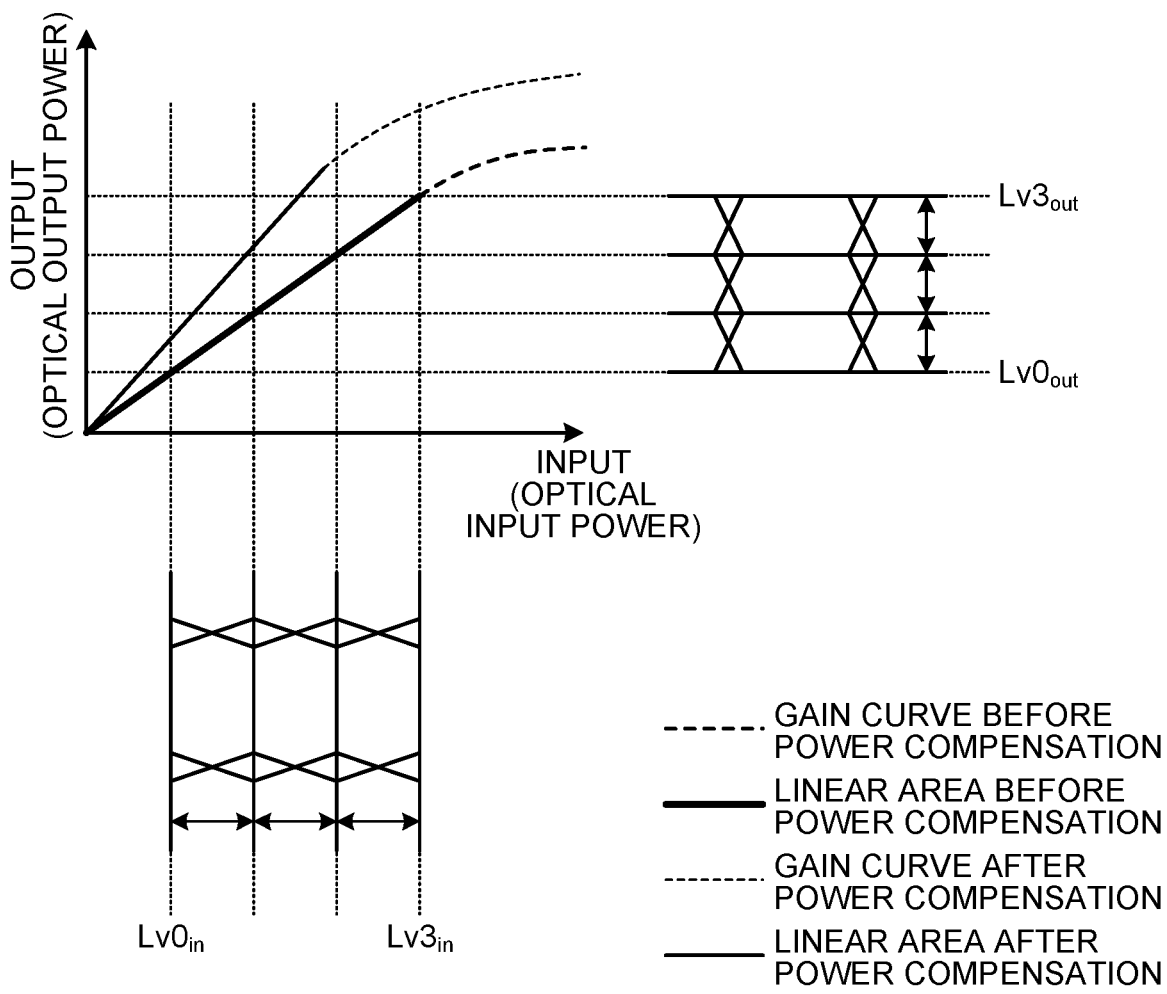
FIG. 20 is an explanatory diagram illustrating an example of optical input-output characteristics of a SOA at an initial setting in Comparative Example 1.

FIG. 20 is an explanatory diagram illustrating an example of optical input-output characteristics of the SOA 114 at an initial setting in Comparative Example 1. The SOA 114 of Comparative Example 1 performs optical amplification within a linear area of the SOA 114 according to an optical input power of the optical signal of the SOA 114 and outputs the optical output power of the optically-amplified optical signal. The amplitude ratios of the optical input power between four levels that are a level 0, a level 1, a level 2 and a level 3 are almost equal. The amplitude ratios of the optical output power between four levels that are a level 0, a level 1, a level 2 and a level 3 approximate equal amplitude ratios, too. It is preferable that the amplitude ratios of the optical input power and the optical output power of the optical signal of the SOA 114 approximate equal amplitude ratios, and this leads to a preferable state of signal quality.

The optical transmitter 100 of Comparative Example 1 adjusts the SOA drive current to be applied to the SOA 114 to cancel changes in the optical output power including changes in optical coupling and supplies the adjusted SOA drive current to the SOA 114. As a result, even the optical transmitter 100 that incorporates the SOA 114 is able to perform drive control on the SOA 114 and thus cancel changes in the optical output power including changes in optical coupling, thereby increasing the signal quality.

Note that, Comparative Example 1 exemplifies the case where changes in the optical output power of the SOA 114 including changes in optical coupling are canceled by the SOA current feedback control method, and the drive current for the LD 112 may be adjusted and a configuration of Comparative Example 2 thereof will be described.

Comparative Example 2

Figure 21:
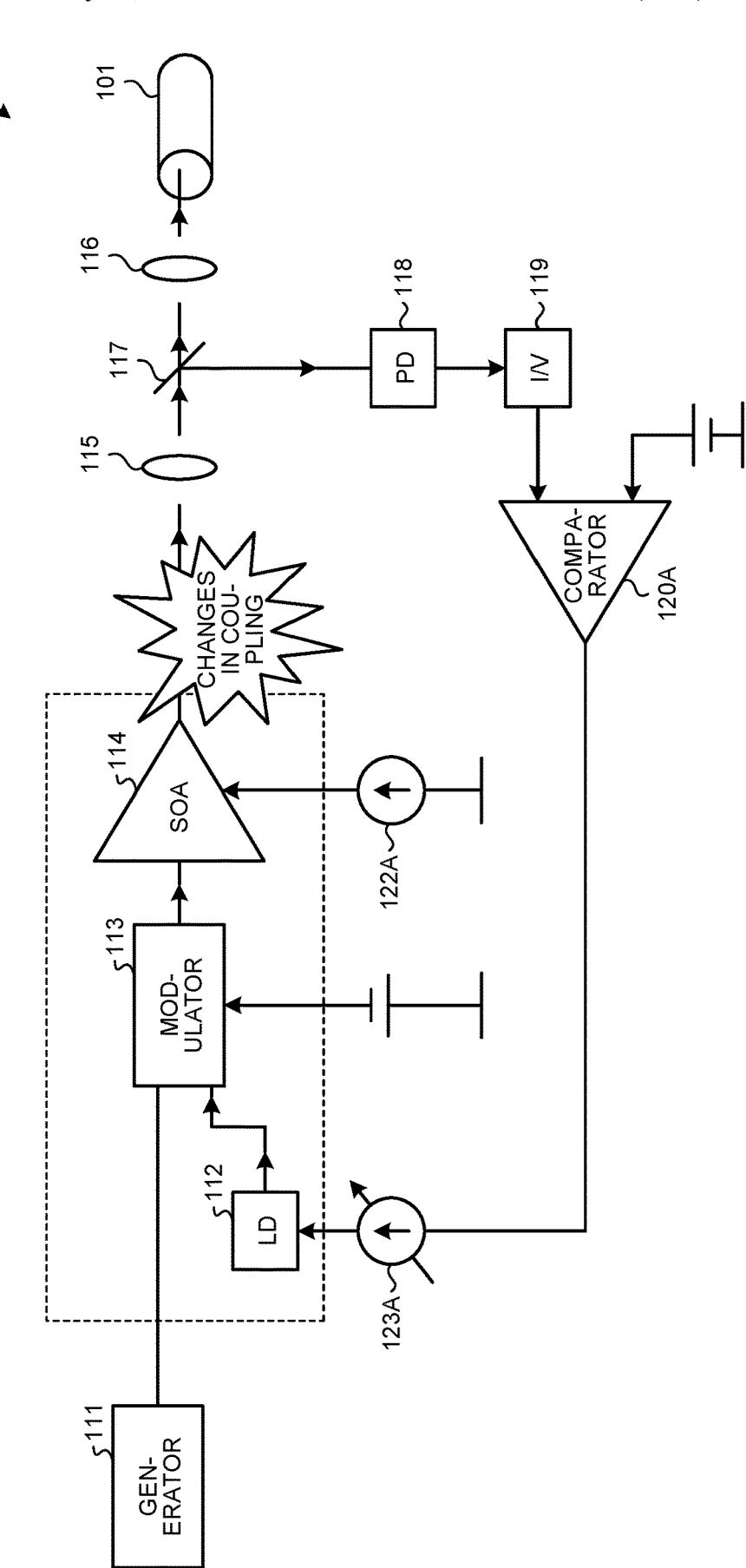
FIG. 21 is an explanatory diagram illustrating an example of a configuration of an optical transmitter of Comparative Example 2.

FIG. 21 is an explanatory diagram illustrating an example of a configuration of an optical transmitter 100A of Comparative Example 2. Note that the same components as those of the optical transmitter 100 of Comparative Example 1 are denoted with the same reference numerals as those of Comparative Example 1 and thus redundant description of the components and operations will be omitted. The optical transmitter 100 of Comparative Example 1 and the optical transmitter 100A of Comparative Example 2 are different in adjusting the LD drive current to be supplied to the LD 112 instead of adjusting the SOA drive current to be supplied to the SOA 114 in order to cancel changes in the optical output power including changes in optical coupling. The optical transmitter 100A employs a LD current feedback control method that adjusts the LD drive current to be supplied to the LD 112 in order to cancel changes in optical coupling.

The optical transmitter 100A includes a comparator 120A, a fixed current source 122A, and a changeable current source 123A in addition to the generator 111, the LD 112, the modulator 113, the SOA 114, the first lens 115, the second lens 116, the branching unit 117, the PD 118, and the voltage converter 119.

The comparator 120A sets a difference signal that is the result of comparison between a monitor voltage value and a target voltage value in the changeable current source 123A. The changeable current source 123A is a current source capable of adjusting the LD drive current to be supplied to the LD 112. The changeable current source 123A outputs the LD drive current in a direction in which changes in the optical output power including changes in optical coupling at an output stage of the SOA 114 are canceled according to the difference signal from the comparator 120A. The fixed current source 122A is a current source for supplying a fixed SOA drive current to be supplied to the SOA 114.

Figure 22:
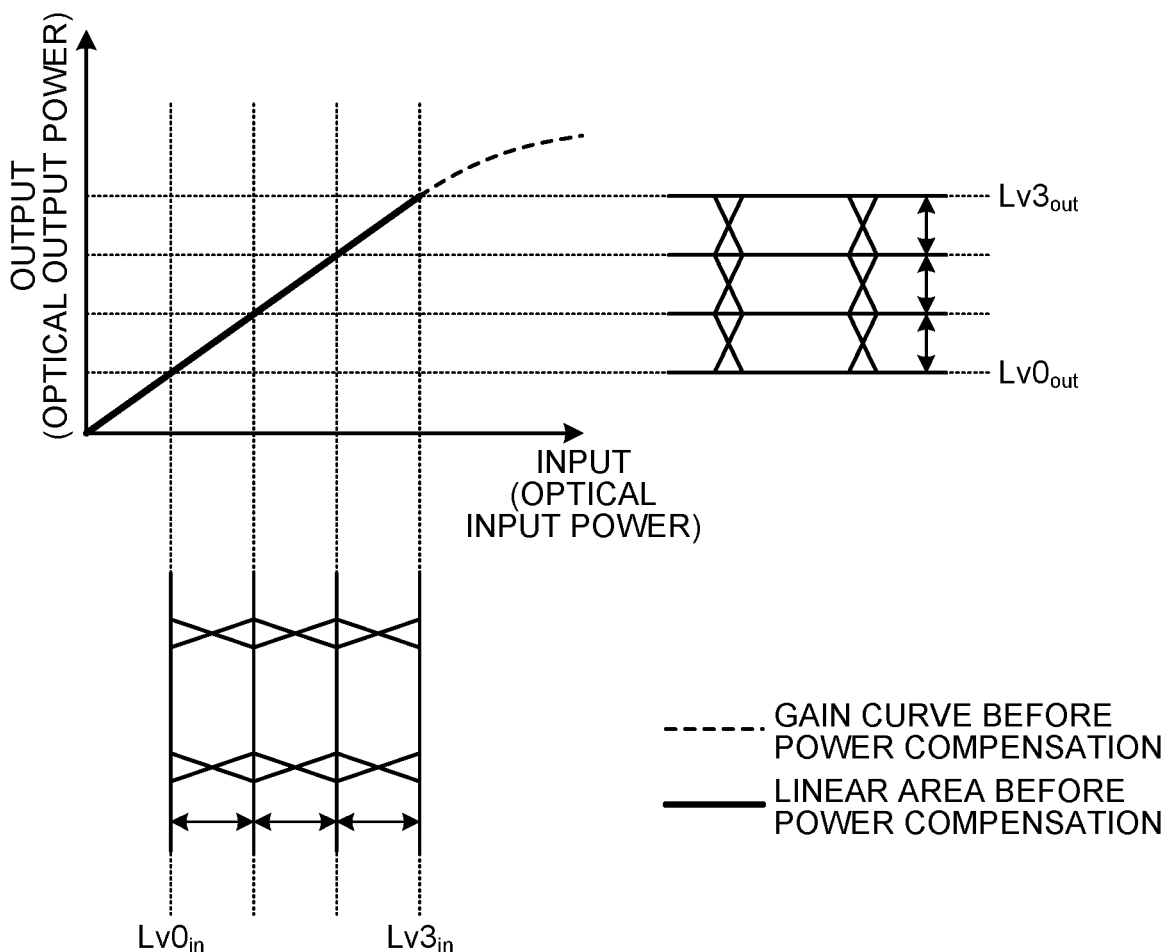
FIG. 22 is an explanatory diagram illustrating an example of optical input-output characteristics of a SOA at an initial setting in Comparative Example 2.

FIG. 22 is an explanatory diagram illustrating an example of optical input-output characteristics of the SOA 114 at an initial setting in Comparative Example 2. The SOA 114 of Comparative Example 2 performs optical amplification within a linear area of the SOA 114 according to an optical input power of an optical signal of the SOA 114 and outputs the optical output power of the optically-amplified optical signal. The amplitude ratios of the optical input power between four levels that are, for example, a level 0, a level 1, a level 2 and a level 3 are almost equal. The amplitude ratios of the optical output power between four levels that are, for example, a level 0, a level 1, a level 2 and a level 3 approximate equal amplitude ratios. It is preferable that the amplitude ratios of the optical input power and the optical output power of the optical signal of the SOA 114 between the levels approximate equal amplitude ratios, and the signal quality is in a preferable state.

The optical transmitter 100A adjusts the LD drive current to be applied to the LD 112 to cancel changes in the optical output power including changes in optical coupling and supplies the adjusted LD drive current to the LD 112. As a result, even the optical transmitter 100A that incorporates the SOA 114 is able to perform drive control on the LD 112 and thus adjust the optical input power to the SOA 114, thereby canceling changes in the optical output power including changes in optical coupling and increasing the signal quality.

Figure 23:
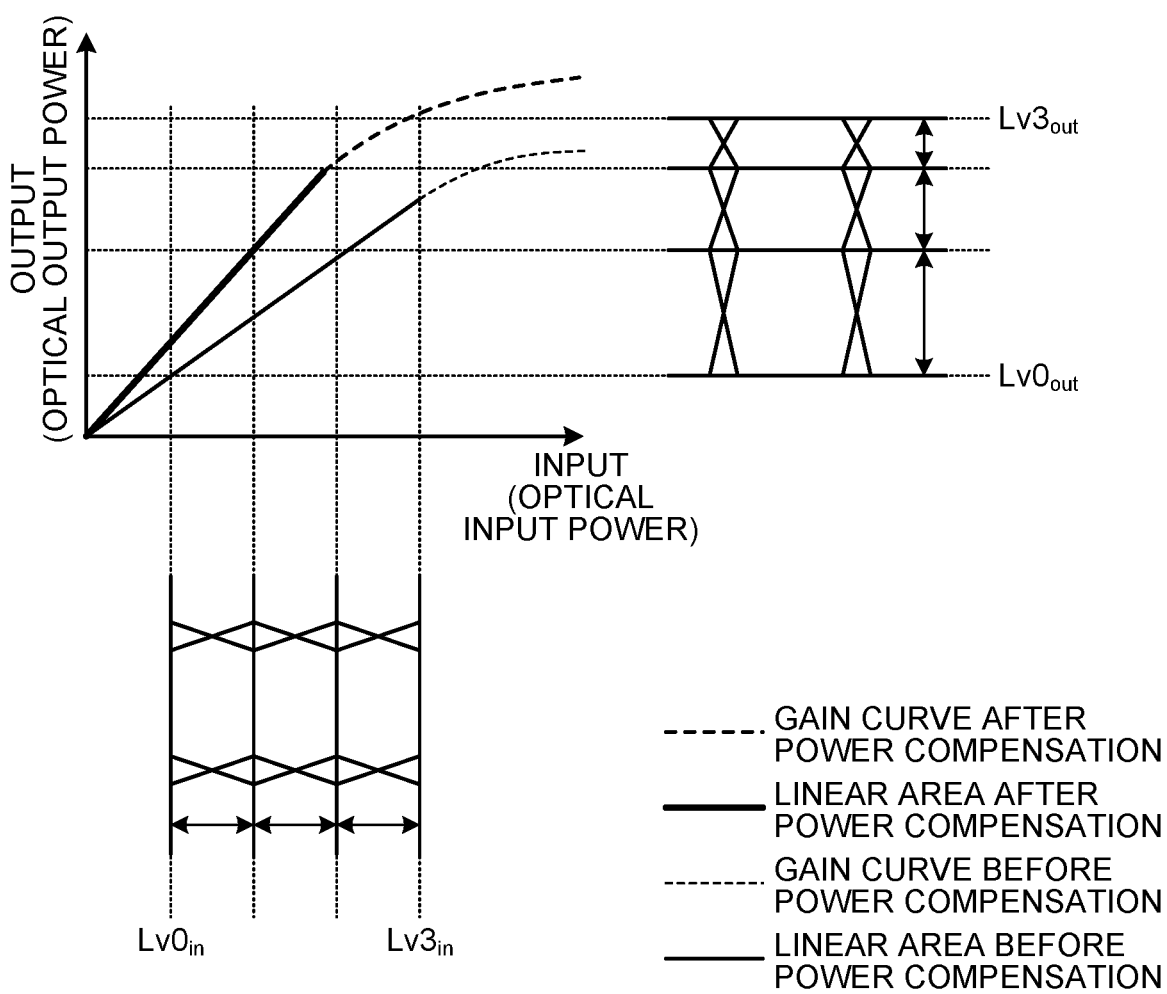
FIG. 23 is an explanatory diagram illustrating an example of optical input-output characteristics of the SOA after power compensation in Comparative Example 1.

FIG. 23 is an explanatory diagram illustrating an example of optical input-output characteristics of the SOA 114 after power compensation in Comparative Example 1. The optical transmitter 100 of Comparative Example 1 adjusts the SOA drive current to be supplied to the SOA 114 and supplies the adjusted SOA drive current to the SOA 114, thereby executing power compensation that cancels changes in the optical output power. When power compensation is executed, the gain of the SOA 114 changes and, as illustrated in FIG. 23, the liner area changes in association with the change in the gain. As a result, inequality in the amplitude ratio of the optical output power between the levels increases due to a non-linear distortion from a saturation area between the linear area and the non-liner area and thus the signal quality deteriorates.

Figure 24:
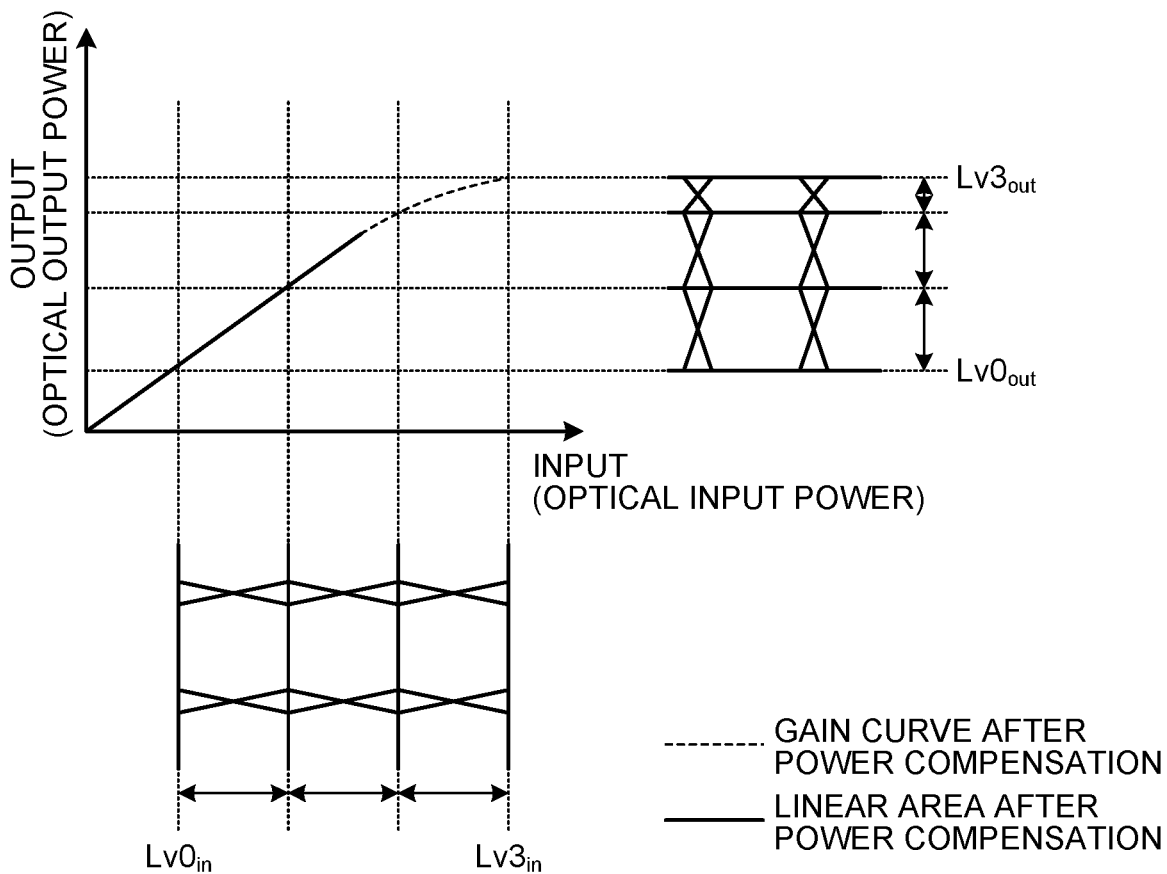
FIG. 24 is an explanatory diagram illustrating an example of optical input-output characteristics of the SOA after power compensation in Comparative Example 2.

FIG. 24 is an explanatory diagram illustrating an example of optical input-output characteristics of the SOA 114 after power compensation in Comparative Example 2. The optical transmitter 100A of Comparative Example 2 adjusts the LD drive current to be supplied to the LD 112 and supplies the adjusted LD drive current to the LD 112, thereby executing power compensation that cancels changes in the optical output power. When power compensation is executed, adjusting the laser light of the LS 112 adjusts the optical input power of the optical signal to be input to the SOA 114 and accordingly the gain of the SOA 114 changes and, as illustrated in FIG. 24, the liner area changes in association with the change in the gain. As a result, inequality in the amplitude ratio of the optical output power between the levels increases due to a non-linear distortion from a saturation area between the linear area and the non-liner area and thus the signal quality deteriorates.

Thus, optical transmitters capable of approximating amplitude ratios of the optical output power between levels to equal amplitude ratios while compensating changes in the optical output power including changes in optical coupling are required.

With reference to the accompanying drawings, embodiments of an optical device and an optical transmitter disclosed herein will be described in detail below. Note that the embodiments do not limit the disclosed technique. The embodiments described below may be combined as appropriate as long as no inconsistency is caused.

First Embodiment

Figure 1:
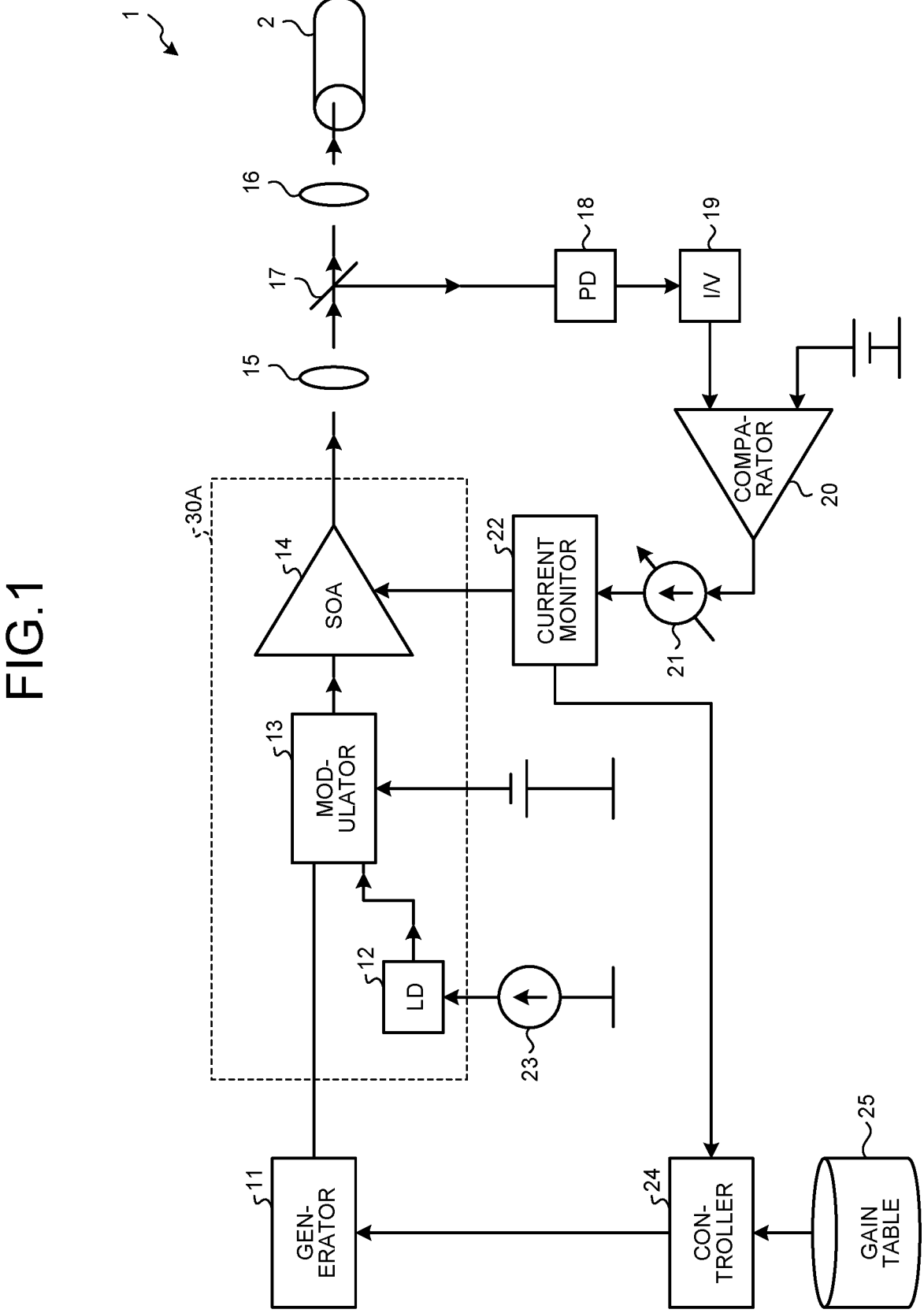
FIG. 1 is an explanatory diagram illustrating an example of a configuration of an optical transmitter of a first embodiment.

FIG. 1 is an explanatory diagram illustrating an example of a configuration of an optical transmitter 1 of a first embodiment. The optical transmitter 1 illustrated in FIG. 1 is an optical transmitter of a high rate exceeding 100 Gbps (50 giga baud rate) per wave that employs PAM4 that is a multilevel amplitude modulation method and that is used for long-distance optical transfer. The optical transmitter 1 illustrated in FIG. 1 includes a generator 11, a laser diode (LD) 12, a modulator 13, a semiconductor optical amplifier (SOA) 14, a first lens 15, a second lens 16, a branching unit 17, a photo diode (PD) 18, and a voltage converter 19. The optical transmitter 1 includes a comparator 20, a changeable current source 21, a current monitor 22, a fixed current source 23, a controller 24, and a gain table 25. In order to cancel changes in optical output power including changes in an optical coupling, the optical transmitter 1 employs the SOA current feedback control system that adjusts a SOA drive current to be supplied to the SOA 14.

The generator 11 generates an electric signal according to a multilevel amplitude modulation method, for example, a PAM4 drive voltage. The LD 12 is a light emitter that emits laser light. The modulator 13 is, for example, a modulator, such as an EA modulator or a Mach Zender (MZ) modulator. The SOA 14 is an optical amplifier that optically amplifies the optical signal that is modulated according to the SOA drive current from the changeable current source 21. The first lens 15 is a lens that focuses the optical signal that is optically amplified by the SOA 14. The second lens 16 is a lens that focuses the optical signal that is focused by the first lens 15 on an optical waveguide in an optical fiber 2 and outputs the focused optical signal. The branching unit 17 is arranged between the first lens 15 and the second lens 16 and branches part of the optically-amplified optical signal that is focused by the first lens 15.

The PD 18 performs photoelectric conversion into a monitor current on the part of the optical signal that is branched by the branching unit 17. The voltage converter 19 converts the monitor current, which is obtained by the PD 18 by performing the photoelectric conversion, into a monitor voltage. The comparator 20 compares a monitor voltage value corresponding to the monitor voltage, which is obtained by the voltage converter 119 by performing the conversion, and a target voltage value and sets a difference signal that is the result of the comparison in the changeable current source 21. Note that the target voltage value is a voltage value corresponding to the target current value of an optical output power of the optical signal of the SOA 14. The PD 18, the voltage converter 19, and the comparator 20 are a monitor unit that monitors the branched part of the optical signal.

The changeable current source 21 is a current source that adjusts the SOA drive current to be supplied to the SOA 14 in a direction in which changes in the optical output power including changes in optical coupling at an output stage of the SOA 14 are canceled according to the difference signal. The current monitor 22 monitors a drive current value of the SOA drive current from the changeable current source 21 and notifies the controller 24 of the drive current value. The fixed current source 23 is a current source that supplies a fixed LD drive current to be supplied to the LD 12. Note that the LD 12, the modulator 13, and the SOA 14 are configured using a single chip 30A.

The controller 24 calculates a setting value for generating a drive voltage to approximate the amplitude ratios of the optical output power of the SOA 14 between the levels to equal amplitude ratios based on a gain curve corresponding to the drive current value of the SOA drive current to be supplied to the SOA 14 and sets the calculated setting value in the generator 11. In other words, the amplitude ratios of the optical output power of the SOA 14 between the levels approximate equal amplitude ratios and accordingly the eyes between the levels approximate uniform eyes, which increases the signal quality.

Figure 2:
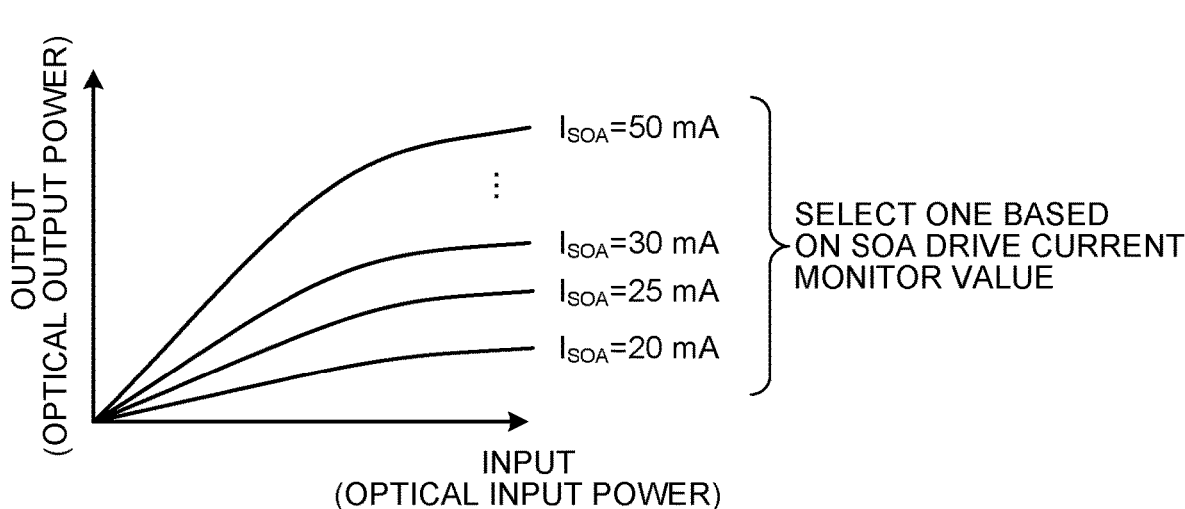
FIG. 2 is an explanatory diagram illustrating an example of SOA gain curves corresponding to respective SOA drive currents.

The gain table 25 is a storage unit that manages the gain curve of the SOA 14 relative to drive current value of the SOA drive current of the SOA 14. FIG. 2 is an explanatory diagram illustrating an example of the SOA gain curves corresponding to respective SOA drive currents. FIG. 3 is an explanatory table presenting an example of table content of the gain table 25.

The optical transmitter 1 previously prepares gain curves that are input-output characteristics of the SOA 14 relative to drive current values of the SOA 14, respectively, as illustrated in FIG. 2. The optical transmitter 1 previously stores the gain curves with respect to the respective drive current values corresponding to the SOA drive current in the gain table 25.

The gain table 25 illustrated in FIG. 25 manages the gain curves of the SOA 14 relative to the drive current values of the SOA 14, respectively. The gain curves are sets of data on the respective drive current values in vertical columns in FIG. 3. When the current monitor 22 detects the current drive current value of the SOA 14 (SOA drive current monitor value), the controller 24 acquires the gain curve corresponding to the drive current value (SOA drive current monitor value) from the gain table 25.

When the gain curve corresponding to the SOA drive current monitor value that is detected by the current monitor 22 is not in the gain table 25, the controller 24 acquires a gain curve corresponding to the drive current value that approximates the SOA drive current monitor value from the gain table 25. Note that, when the gain curve corresponding to the SOA drive current monitor value that is detected by the current monitor 22 is not in the gain table 25, the controller 24 acquires the two gain curves corresponding to the top two drive current values that approximate the SOA drive current monitor value from the gain table 25. The controller 24 may generate a gain curve corresponding to the current drive current value by performing liner interpolation on the acquired two gain curves. The gain table 25 may prepare the gain curves corresponding to the respective drive current values using an increased resolution and a smaller unit such that an error in the drive current value of the SOA 14 can be ignored and the gain table 25 is changeable.

The controller 24 calculates the acquired gain curve, the amplitude of the optical input power, and an average power of the optical input power. Based on the gain curve, the amplitude of the optical input power, and the average power, the controller 24 calculates a setting value for the generator 11 to generate a drive voltage for generating an optical input power according to which the amplitude ratios of the optical output power that is the optical signal of the SOA 14 between the levels approximate equal amplitude ratios.

Figure 4:
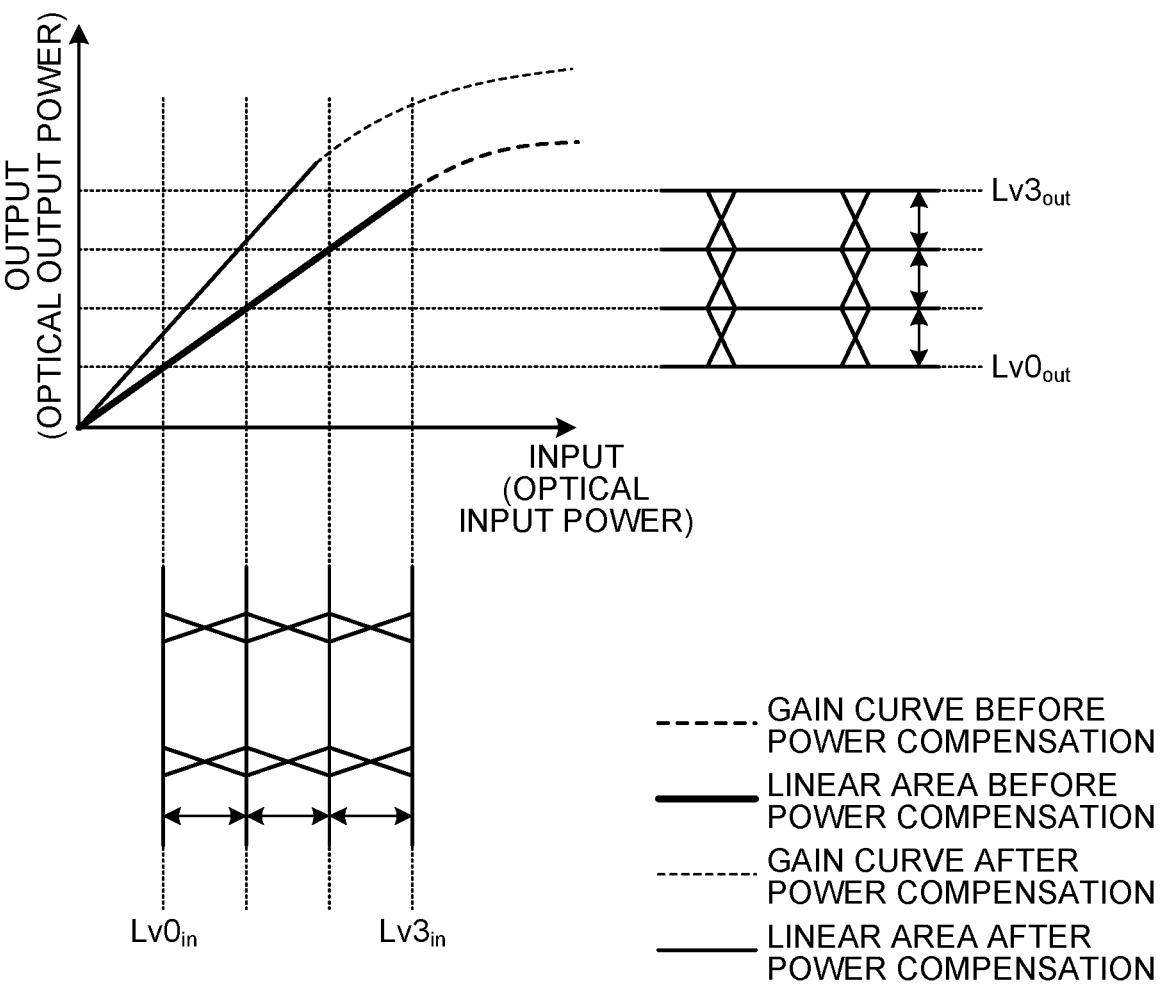
FIG. 4 is an explanatory diagram illustrating an example of optical input-output characteristics of a SOA at an initial setting.

FIG. 4 is an explanatory diagram illustrating an example of optical input-output characteristics of the SOA 14 at an initial setting. As illustrated in FIG. 4, the SOA 14 performs optical amplification within a linear area of the SOA 14 according to the optical input power of the optical signal of the SOA 14 and outputs the optical output power of the optically-amplified optical signal. The amplitude ratios of the optical input power between four levels that are a level 0, a level 1, a level 2 and a level 3 approximate equal amplitude ratios. The amplitude ratios of the optical output power between four levels that are a level 0, a level 1, a level 2 and a level 3 approximate equal amplitude ratios, too. It is preferable that the amplitude ratios of the optical input power and the optical output power of the optical signal of the SOA 114 be almost equal, and the signal quality is in a preferable state.

Figure 5:
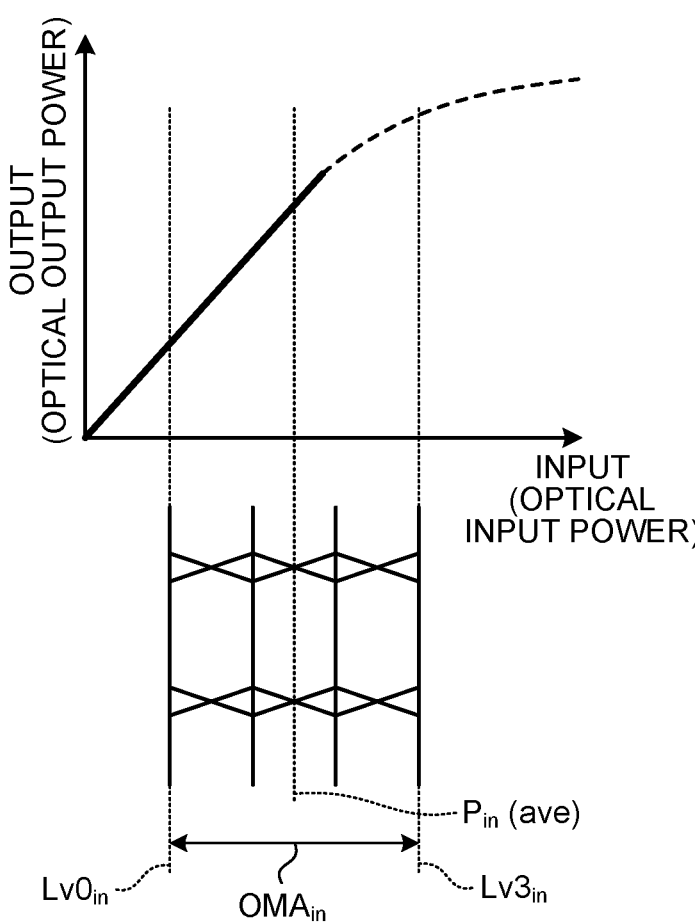
FIG. 5 is an explanatory diagram illustrating calculation of optical input powers at a level 0 and a level 3 in the optical input-output characteristics of the SOA after power compensation.

FIG. 5 is an explanatory diagram illustrating calculation of optical input powers at the level 0 and the level 3 in the optical input-output characteristics of the SOA 14 after power compensation. The controller 24 acquires an amplitude (OMAin) of the optical input power and an average power (Pin(ave)) of the optical input power. By assigning the amplitude (OMAin) of the optical input power and the average power (Pin(ave)) of the optical input power in (Expression 1), the controller 24 calculates an optical input power (Lv0in) at the level 0 and an optical input power (Lv3in) at the level 3.

$$\begin{cases} Lv0_{in} = P_{in}(ave) - OMA_{in}/2 \\ Lv3_{in} = P_{in}(ave) + OMA_{in}/2 \end{cases} \tag{1}$$

Figure 6:
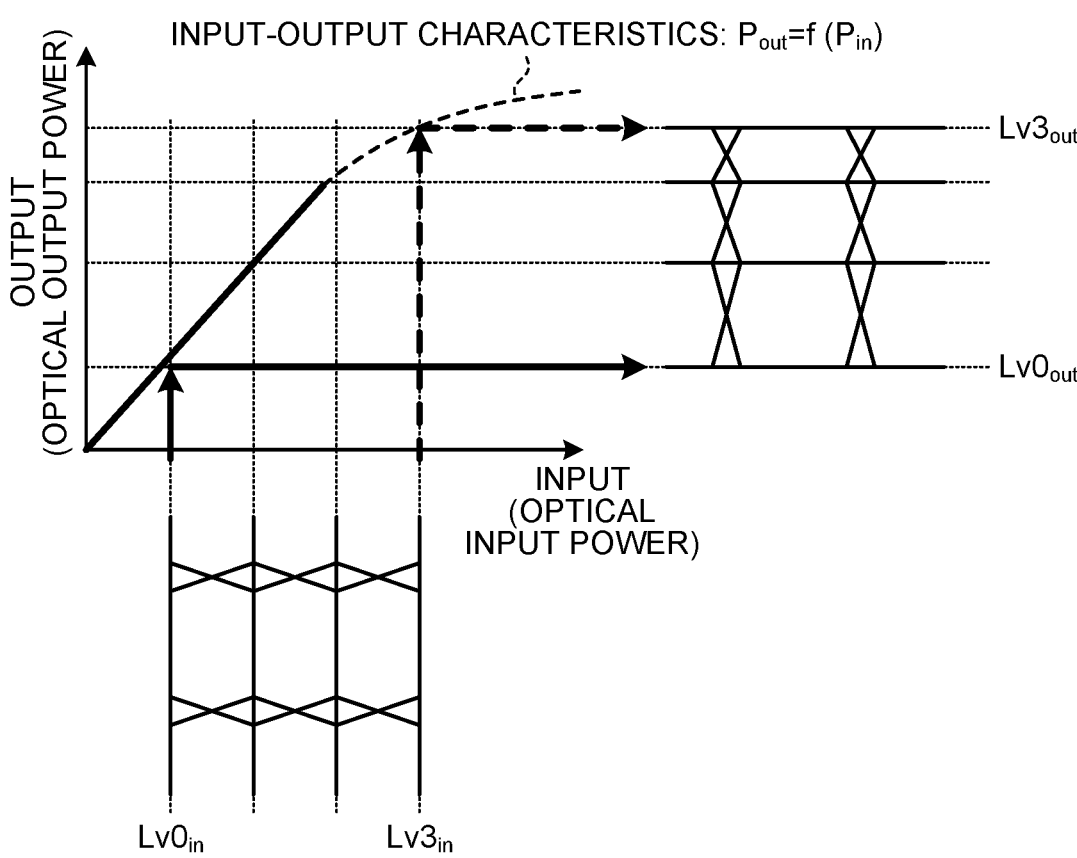
FIG. 6 is an explanatory diagram illustrating calculation of optical output powers at the level 0 and the level 3 in the optical input-output characteristics of the SOA after power compensation.

FIG. 6 is an explanatory diagram illustrating calculation of optical output powers at the level 0 and the level 3 in the optical input-output characteristics of the SOA after power compensation. The controller 24 acquires a gain curve corresponding to the SOA drive current value. Furthermore, the controller 24 calculates an optical output power (Lv0out) at the level 0 and an optical output power (Lv3out) at the level 3 by assigning the optical input power (Lv0in) at the level 0 and the optical input power (Lv3in) at the level 3 in (Expression 2) based on the acquired gain curve, where f is a function representing the input-output characteristics of the SOA corresponding to the SOA drive current and the optical output power (Pout) corresponding to the optical input power (Pin) is expressed by f(Pin).

$$\begin{cases} Lv0_{out} = f(Lv0_{in}) \\ Lv3_{out} = f(Lv3_{in}) \\ OMA_{out} = Lv3_{out} - Lv0_{out} \end{cases} \tag{2}$$

Furthermore, by assigning the optical output power (Lv0out) at the level 0 and the optical output power (Lv3out) at the level 3 in (Expression 3), the controller 24 calculates an amplitude (OMAout) of the optical output power.

$$OMA_{out} = Lv3_{out} - Lv0_{out} \tag{3}$$

Figure 7:
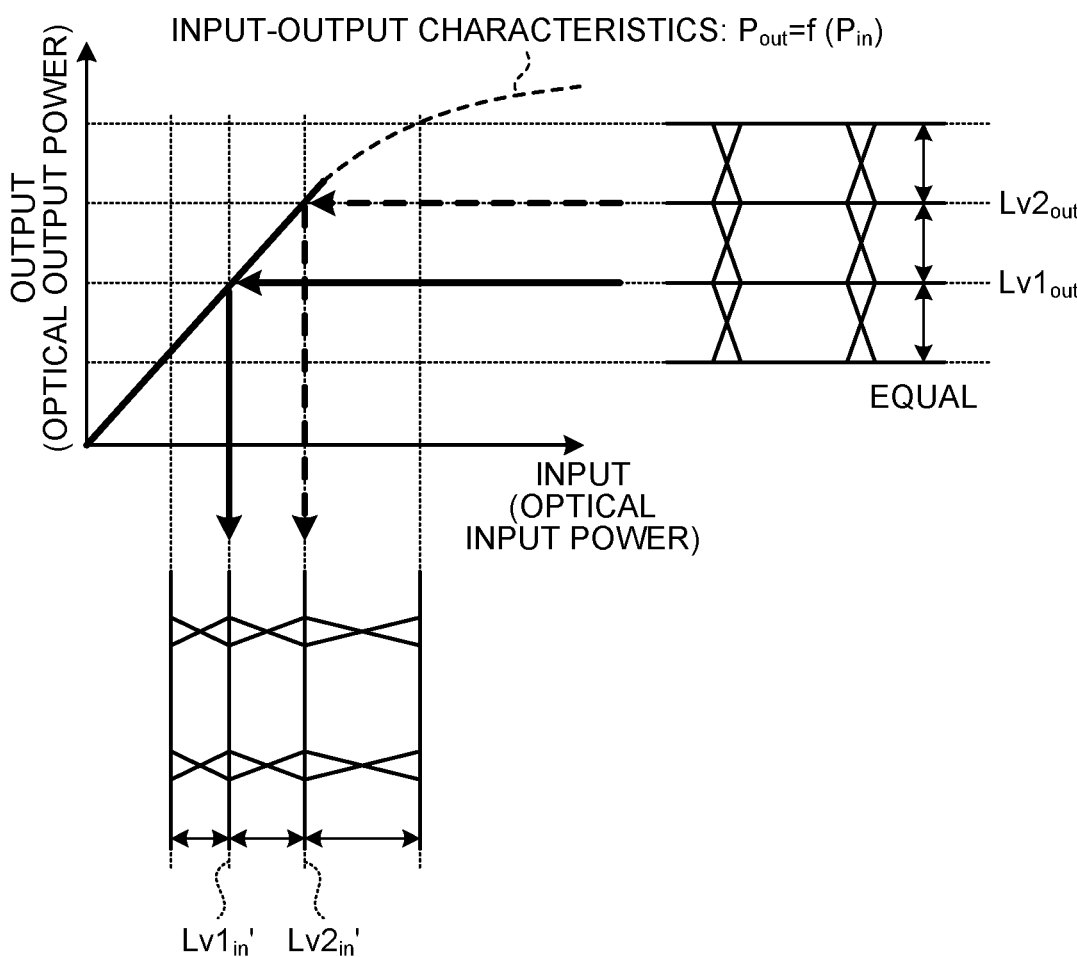
FIG. 7 is an explanatory diagram illustrating calculation of an optical input power that equalize the amplitude ratios of the optical output power between levels.

FIG. 7 is an explanatory diagram illustrating calculation of an optical input power for approximating the amplitude ratios of the optical output power between levels to equal amplitude ratios. By assigning the optical output power (Lv0out) at the level 0 and the amplitude (OMA0out) of the optical output power in (Expression 4), the controller 24 calculates an optical output power (Lv1out') at the level 1 and the optical output power (Lv2out') at the level 2 in which the amplitude ratios between levels approximate equal amplitude ratios.

$$\begin{cases} Lv1'_{out} = Lv0_{out} + \dfrac{1}{3} \cdot OMA_{out} \\ Lv2'_{out} = Lv0_{out} + \dfrac{2}{3} \cdot OMA_{out} \end{cases} \tag{4}$$

The controller 24 assigns the optical output powers at the level 1 and the level 2 in which the amplitude ratios between the levels approximate equal amplitude ratios in (Expression 5). In other words, using an inverse function of the input-output characteristics, the controller 24 calculates an optical input power (Lv1in') at the level 1 and an optical input power (Lv2in') at the level 2 corresponding to the optical output powers in which the amplitude ratios between the levels approximate equal amplitude ratios.

$$\begin{cases} Lv1'_{in} = f^{-1}(Lv1'_{out}) \\ Lv2'_{in} = f^{-1}(Lv2'_{out}) \end{cases} \tag{5}$$

Figure 8:
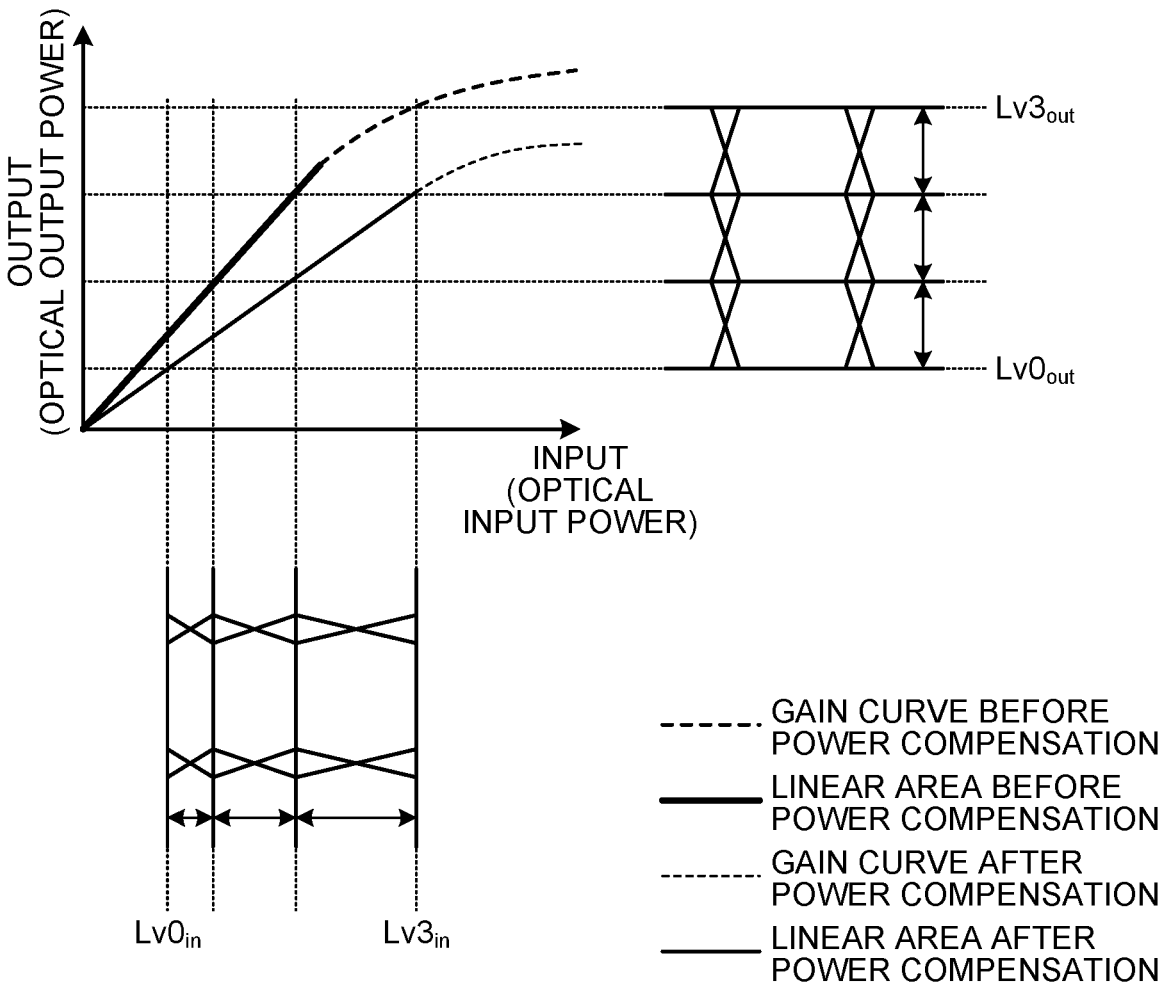
FIG. 8 is an explanatory diagram illustrating an example of the optical input-output characteristics of the SOA after non-linear distortion correction after power compensation.

By assigning the optical input powers at the level 1 and the level 2 corresponding to the optical output powers in which the amplitude ratios between the levels approximate equal amplitude ratios in (Expression 6), the controller 24 calculates drive voltages at the level 1 and the level 2 to be input to the modulator 13 that correspond to the optical output powers in which the amplitude ratios between the levels approximate equal amplitude ratios. In other words, when the input-output characteristics of the optical signal that is modulated by the modulator 13 according to the drive voltage are linear, the input optical wave of the SOA 14 and a drive voltage waveform of the modulator 13 has the same eye balance. The controller 24 thus controls the generator 11 such that the generator 11 generates an input optical waveform Lv1in of the SOA 14 and a drive voltage (V1) at the level 1 and a drive voltage (V2) at the level 2 of the drive voltage waveform at the same ratios as those of LV1in. When the input-output characteristics of the optical signal that is modulated by the modulator 13 according to the drive voltage are not linear, the controller 24 calculates a setting voltage using an inverse function of the input-output characteristics of the modulator 13 and controls the generator 11.

$$\begin{cases} V1'_{in} = g^{-1}(Lv1'_{in}) \\ V2'_{in} = g^{-1}(L2'_{in}) \end{cases} \tag{6}$$

where $V1'_{in}$ is a drive voltage of the corrected modulator input at level 1, $V2'_{in}$ is a drive voltage of the corrected modulator input at level 2, and $g^{-1}(x)$ is an inverse function of the modulator input characteristics $g(x)$ FIG. 8 is an explanatory diagram illustrating an example of the optical input-output characteristics of the SOA after non-linear distortion correction after power compensation. After the controller 24 sets the setting value of the drive voltage calculated by (Expression 6) in the generator 11, while the amplitude ratios of the optical input power of the SOA 14 between the levels after power compensation are different, the amplitude ratios of the optical output power of the SOA 14 between the levels after power compensation after the optical amplification approximate equal amplitude ratios. As a result, it is possible to compensate the optical output waveform distortion due to the non-linear distortion of the SOA 14.

Figure 9:
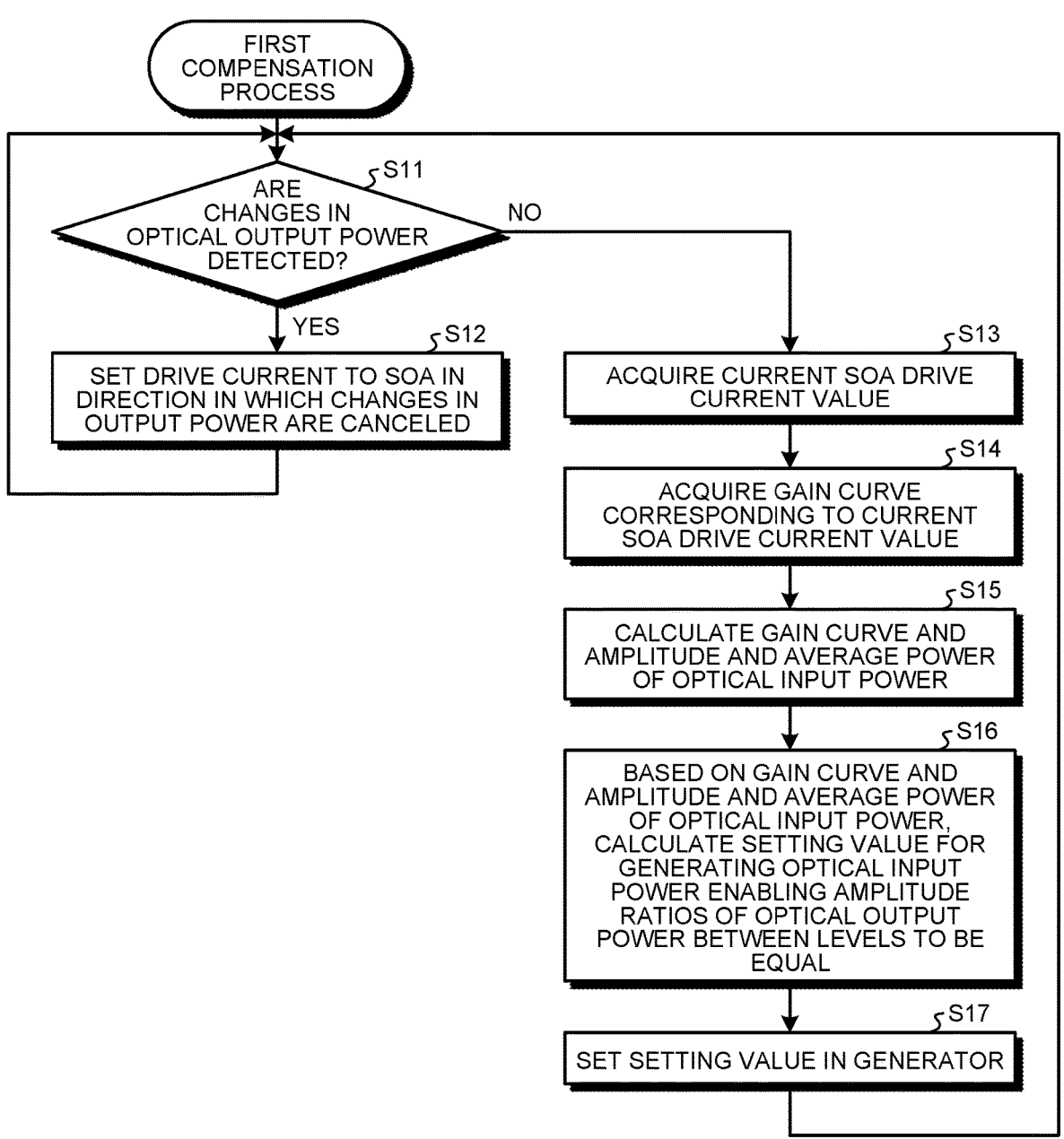
FIG. 9 is a flowchart illustrating an example of process operations performed by the optical transmitter that relate to a first compensation process.

FIG. 9 is a flowchart illustrating an example of process operations performed by the optical transmitter 1 that relate to a first compensation process. Note that the first compensation process that compensates the optical output waveform distortion due to the non-liner distortion of the SOA 14 is continuously executed during communication with an opposing optical receiver. The comparator 20 in the optical transmitter 1 determines whether changes in the optical output power of the SOA 14 are detected based on a difference signal of the comparator 20 (step S11). Note that the changes in the optical output power are changes in the optical output power including changes in optical coupling that relate to optical components between the SOA 14 and the optical fiber 2. When changes in the optical output power are detected (YES at step S11), the comparator 20 sets, in the changeable current source 21, a SOA drive current to be supplied to the SOA 14 in a direction in which the changes in the optical output power including changes in optical coupling are canceled (step S12). As a result, the optical transmitter 1 is able to cancel the changes in the optical output power including changes in optical coupling by performing drive control on the SOA 14 according to the SOA drive current.

After setting the SOA drive current for canceling the changes in the optical output power, the comparator 20 moves to step S11 in order to determine whether changes in the optical output power are detected. When changes in the optical output power are not detected (NO at step S13), the controller 24 in the optical transmitter 1 acquires a SOA drive current value corresponding to the current SOA drive current from the current monitor 22 (step S13).

The controller 24 acquires a gain curve of the SOA 14 corresponding to the current SOA drive current value from the gain table 25 (step S14) and calculates the acquired gain curve, the amplitude of the optical input power of the SOA 14, and the average power of the optical input power (step S15).

Based on the gain curve of the SOA 14, the amplitude of the optical input power of the SOA 14, and the average power, the controller 24 calculates a setting value corresponding to a drive voltage for generating an optical input power such that amplitude ratios of the optical output power between levels approximate equal amplitude ratio (step S16). Furthermore, the controller 24 sets the calculated setting value in the generator 11 (step S17) and returns to the process at step S11 in order to determine whether changes in the optical output power of the SOA 14 are detected. In other words, the generator 11 generates a drive voltage to be applied to the modulator 13 such that the amplitude ratios of the optical output power of an optical signal of the SOA 14 between levels approximate equal amplitude ratios. The modulator 13 optically modulates a laser light according to the drive voltage and outputs the optical signal to the SOA 14. The SOA 14 performs optical amplification according to the SOA drive current and outputs an optical output power in which amplitude ratios between the levels after the optical amplification approximate equal amplitude ratios. As a result, canceling the optical output waveform distortion resulting from non-linear distortion of the SOA 14 makes it possible to increase signal quality.

The optical transmitter 1 of the first embodiment acquires input-output characteristics (gain curve) corresponding to the SOA drive current from the gain table 25 and, based on the acquired gain curve, controls the generator 11 such that the generator 11 generates a drive voltage for approximating the amplitude ratios between levels that are the respective levels of the optical output power of the SOA 14 to equal amplitude ratios. As a result, by compensating the optical output waveform distortion resulting from the non-linear distortion of the SOA 14, the optical transmitter 1 increases the signal quality.

Based on the gain curve corresponding to the SOA drive current, the amplitude of the optical input power of the SOA 14, and the average power of the SOA 14 at each level, the optical transmitter 1 controls the generator 11 such that the generator 11 generates a drive voltage for approximating the amplitude ratios of the optical output power of the SOA 14 between levels to equal amplitude ratios. As a result, by compensating the optical output waveform distortion resulting from the non-linear distortion of the SOA 14, the optical transmitter 1 increases the signal quality.

Based on the monitor value of the PD 18, the optical transmitter 1 adjusts the SOA drive current to the SOA 14. As a result, the optical transmitter 1 is able to cancel changes in the optical output power (optical output intensity) including changes in optical coupling.

The optical transmitter 1 is able to cancel changes in the optical output power including changes in optical coupling while ensuring signal quality by compensating the optical output waveform distortion resulting from the non-linearity of the SOA 14. Compensating the non-linear distortion of the SOA 14 makes it possible to use the SOA 14 under the condition that the linearity is low and the gain is high, thereby realizing an increase in the optical output power.

The PD 18 need not be in the optical transmitter 1 and, for example, the PD 18 may be in the opposing optical receiver or a relay device and a change may be made as appropriate.

Note that the optical transmitter 1 of the first embodiment exemplifies the case of controlling the generator 11 such that a drive voltage enabling the amplitude ratios of the optical output power of the SOA 14 between the levels to approximate equal amplitude ratios while compensating changes in optical coupling by adjusting the drive current to the SOA 14. Changes in optical coupling may be compensated by adjusting the drive current to the LD 12 instead of the drive current to the SOA 14 and an embodiment of that case will be described as a second embodiment below.

Second Embodiment

Figure 10:
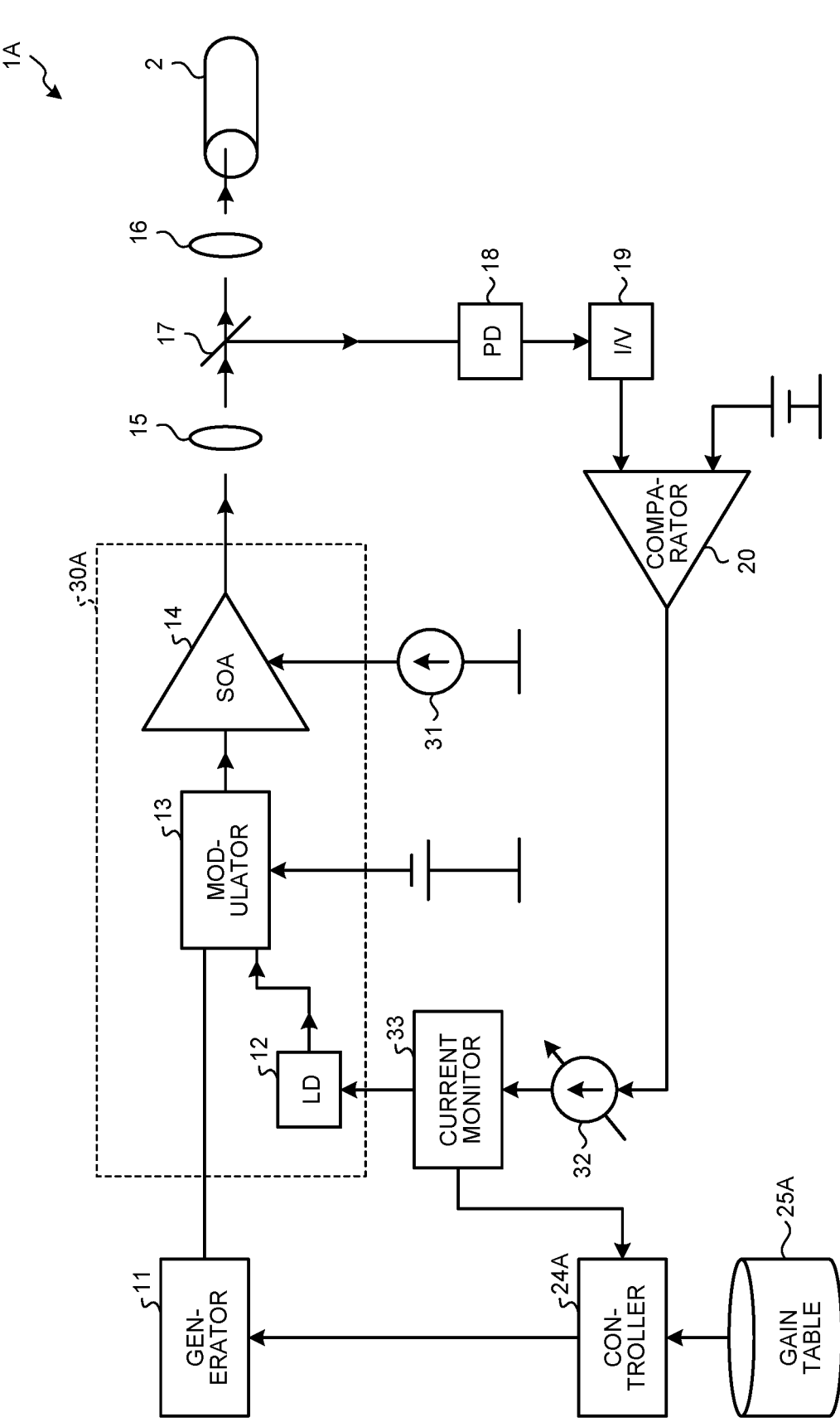
FIG. 10 is an explanatory diagram illustrating an example of a configuration of an optical transmitter of a second embodiment.

FIG. 10 is an explanatory diagram illustrating an example of a configuration of an optical transmitter 1A of the second embodiment. Note that the same components as those of the optical transmitter 1 of the first embodiment are denoted with the same reference numerals as those of the first embodiment and thus redundant description of the components and operations will be omitted. The optical transmitter 1A illustrated in FIG. 10 includes the generator 11, the LD 12, the modulator 13, the SOA 14, the first lens 15, the second lens 16, the branching unit 17, the PD 18, and the voltage converter 19. The optical transmitter 1A further includes the comparator 20, a fixed current source 31, a changeable current source 32, a current monitor 33, a controller 24A, and a gain table 25A. In order to cancel changes in an optical output power including changes in optical coupling, the optical transmitter 1A employs the LD current feedback control system that adjusts a LD drive current to be supplied to the LD 12.

The comparator 20 sets a difference signal that is the result of comparison between a monitor voltage value and a target voltage value in the changeable current source 32. The changeable current source 32 is a current source capable of changing the LD drive current to be supplied to the LD 12 according to the difference signal. The fixed current source 31 is a current source that supplies a fixed SOA drive current to be supplied to the SOA 14.

The controller 24A calculates a setting value for the generator 11 to generate a drive voltage enabling amplitude ratios of an optical output power of the SOA 14 between levels to approximate equal amplitude ratios and sets the calculated setting value in the generator 11. In other words, the amplitude ratios of the optical output power of the SOA 14 between the levels are approximated to equal amplitude ratios and accordingly the eyes between the levels approximate uniform eyes, which enables an increase in the signal quality. The gain table 25A is a table that manages gain curves of the SOA 14 relative to LD drive current values, respectively.

The optical transmitter 1A previously prepares gain curves that are input-output characteristics of the SOA 14 for drive current values of the SOA 14, respectively, corresponding to the LD drive current value. The optical transmitter 1A previously stores the gain curves of the SOA 14 relative to respective drive current values corresponding to the SOA drive current in the gain table 25A.

The gain table 25A manages the gain curves of the SOA 14 relative to the respective SOA drive current values, respectively. When the current monitor 33 detects a current LD drive current value, the controller 24A acquires, from the gain table 25A, an optical input power and an optical output power that are optical signals that are gain curves corresponding to the SOA drive current value corresponding to the LD drive current value and that relate to the input and output of the SOA 14. The controller 24A calculates the acquired gain curve and an amplitude and an average power of the optical input power. Based on the gain curve and the amplitude and the average power of the optical input power, the controller 24A calculates a setting value for causing the generator 11 to generate a drive voltage for generating an optical input power according to which amplitude ratios of the optical output power, which is the optical signal of the SOA 14, between the levels approximate equal amplitude ratios.

Figure 11:
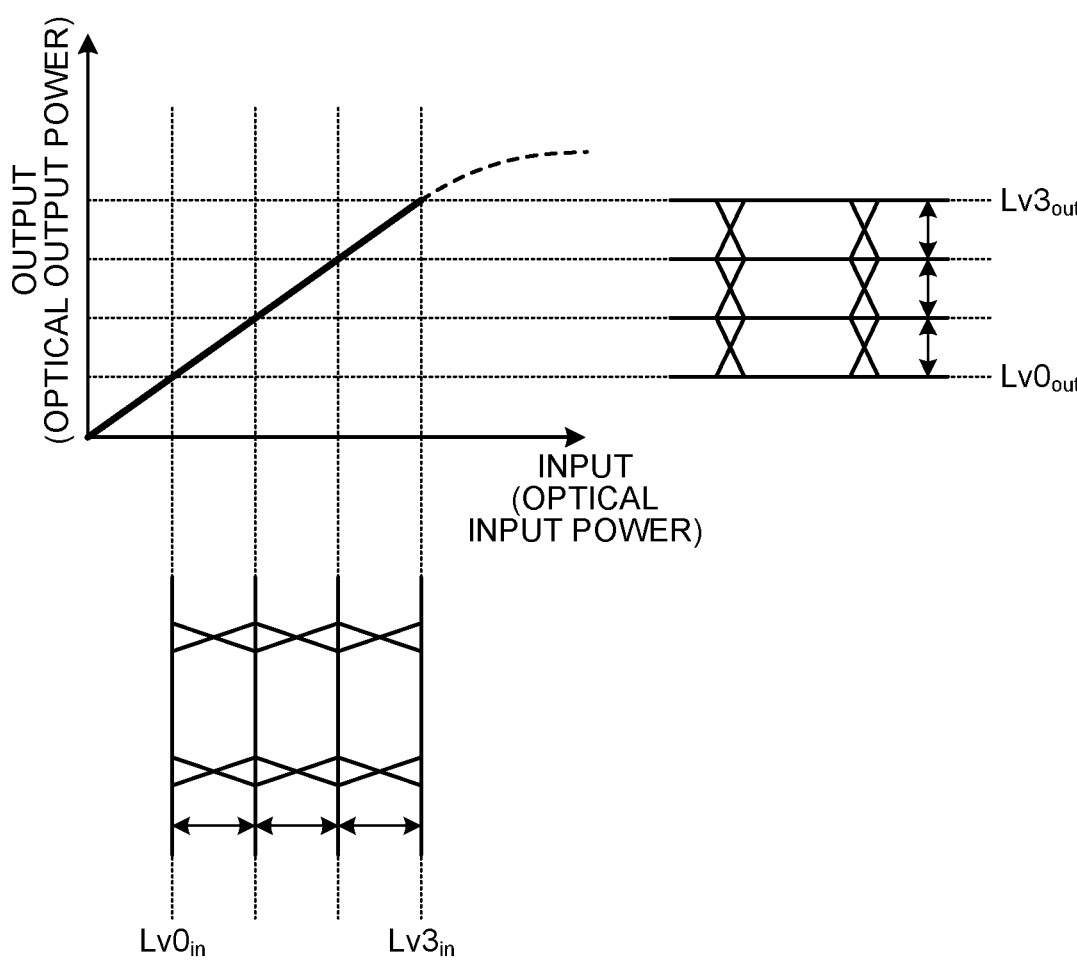
FIG. 11 is an explanatory diagram illustrating an example of optical input-output characteristics of a SOA at an initial setting.

FIG. 11 is an explanatory diagram illustrating an example of optical input-output characteristics of the SOA 14 at an initial setting. As illustrated in FIG. 11, the SOA 14 performs optical amplification within a linear area of the SOA 14 according to the optical input power of the optical signal of the SOA 14 and outputs the optical output power of the optically-amplified optical signal. The amplitude ratios of the optical input power between four levels that are a level 0, a level 1, a level 2 and a level 3 are almost equal. The amplitude ratios of the optical output power between four levels that are a level 0, a level 1, a level 2 and a level 3 are almost equal, too. It is preferable that the amplitude ratios of the optical input power and the optical output power of the optical signal of the SOA 14 be almost equal, and the signal quality is in a preferable state.

Figure 12A:
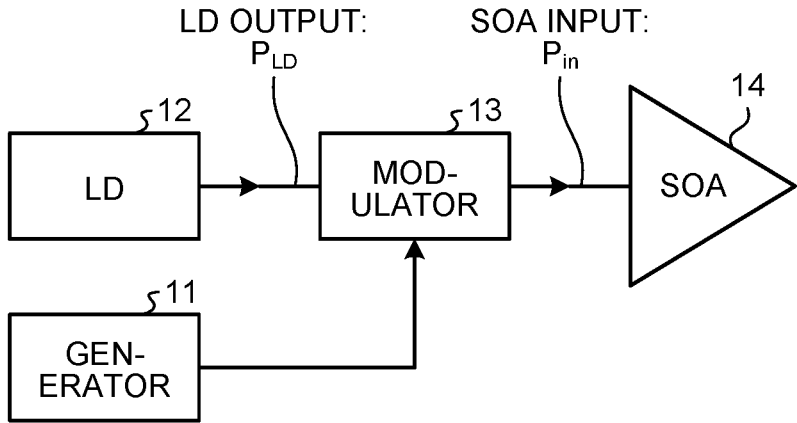
FIG. 12A is an explanatory diagram illustrating an example of a relationship of a LD output and a SOA input.

FIG. 12A is an explanatory diagram illustrating an example of a relationship of a LD output and a SOA input. An optical output of the LD 12 illustrated in FIG. 12A is a LD output (PLD) and an optical input power that is an optical input to the SOA 14 is a SOA input (Pin).

Figure 12B:
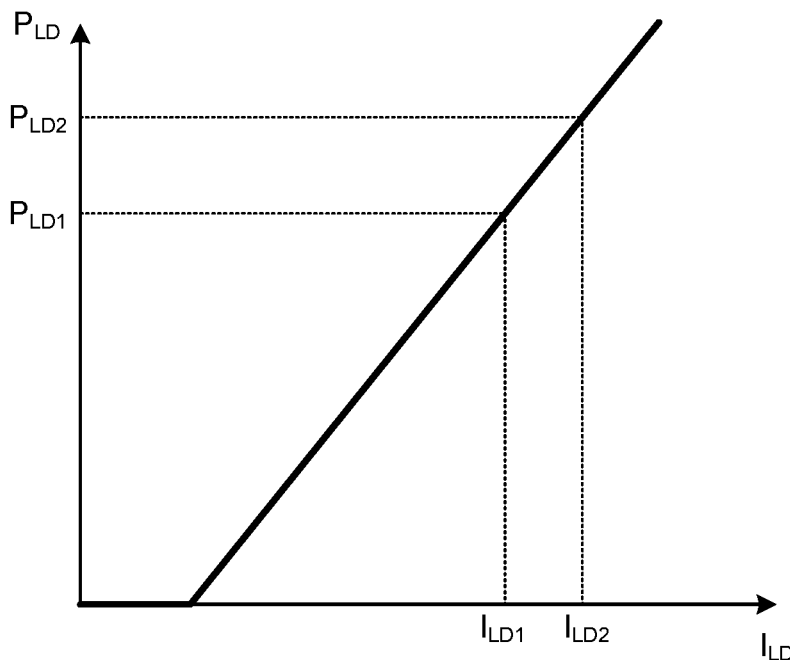
FIG. 12B is an explanatory diagram illustrating an example of characteristics between the LD drive current and the optical output power.

FIG. 12B is an explanatory diagram illustrating an example of characteristics between the LD drive current and the optical output power. When the LD drive current value supplied to the LD 12 increases from ILD1 to ILD2, the LD optical output increases from PLD1 to PLD2. The controller 24A calculates a LD optical output by (Expression 7). Note that coefficients k and m are used because the LD 12 has a product difference and environmental difference individually.

$$P_{LD} = k \cdot I_{LD} + m \qquad (7)$$

where k and m are coefficients (k>0, m<0) of each individual LD

Figure 13:
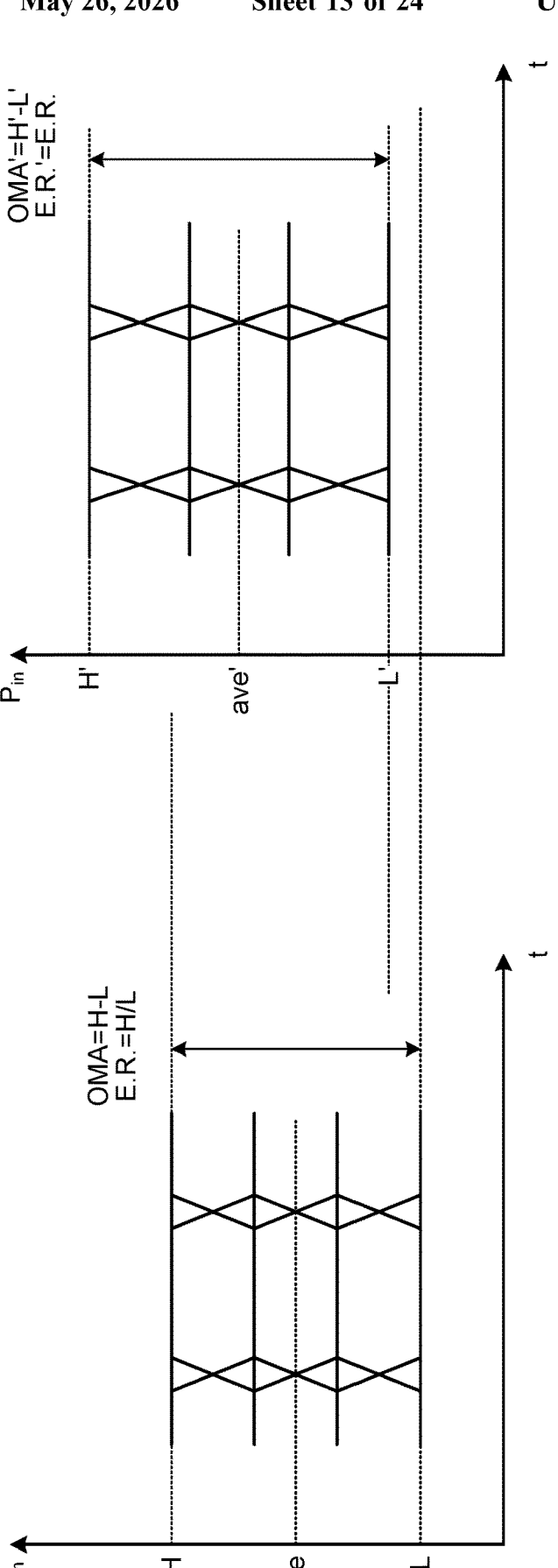
FIG. 13 is an explanatory diagram illustrating an example of an optical waveform examples before and after a change in the LD drive current.

FIG. 13 is an explanatory diagram illustrating an example of an optical waveform examples before and after a change in the LD drive current. When the LD drive current value increases from ILD1 to ILD2, the optical waveform changes from the optical waveform on the left in FIG. 13 to the optical waveform on the right in FIG. 13. In other words, the amplitude of the optical input power increases. By assigning the LD optical output PLD1 and the LD optical output PLD2 in (Expression 8), the controller 24A calculates an average power ave' of the optical input power after the change in the LD drive current.

$$ave' = ave \times \frac{P_{LD2}}{P_{LD1}} \qquad (8)$$

By assigning the LD optical output PLD1, the LD optical output PLD2, and the average power ave' of the optical input power in (Expression 9), the controller 24A calculates an amplitude OMA of the optical input power after the change in the LD drive current.

$$OMA' = OMA \times \frac{ave'}{ave} = OMA \times \frac{P_{LD2}}{P_{LD1}} \qquad (9)$$

The controller 24A calculates an extinction ratio (E.R.) based on an optical input power (L) at a level 0, an optical input power (H) at a level 3, and the average of the optical input power.

The controller 24A calculates an optical input power with respect to the input-output characteristics of the SOA 14 based on the gain curve corresponding to the LD drive current value after the change and the average power ave' and the amplitude OMA' of the optical input power after the change in the LD drive current. Note that the second embodiment exemplifies the case where the average power ave' and the amplitude OMA' of the optical input power after the change in the LD drive current are calculated according to (Expression 8) and (Expression 9); however, they may be stored in a lookup table that is prepared in advance and a change may be made as appropriate.

Figure 14:
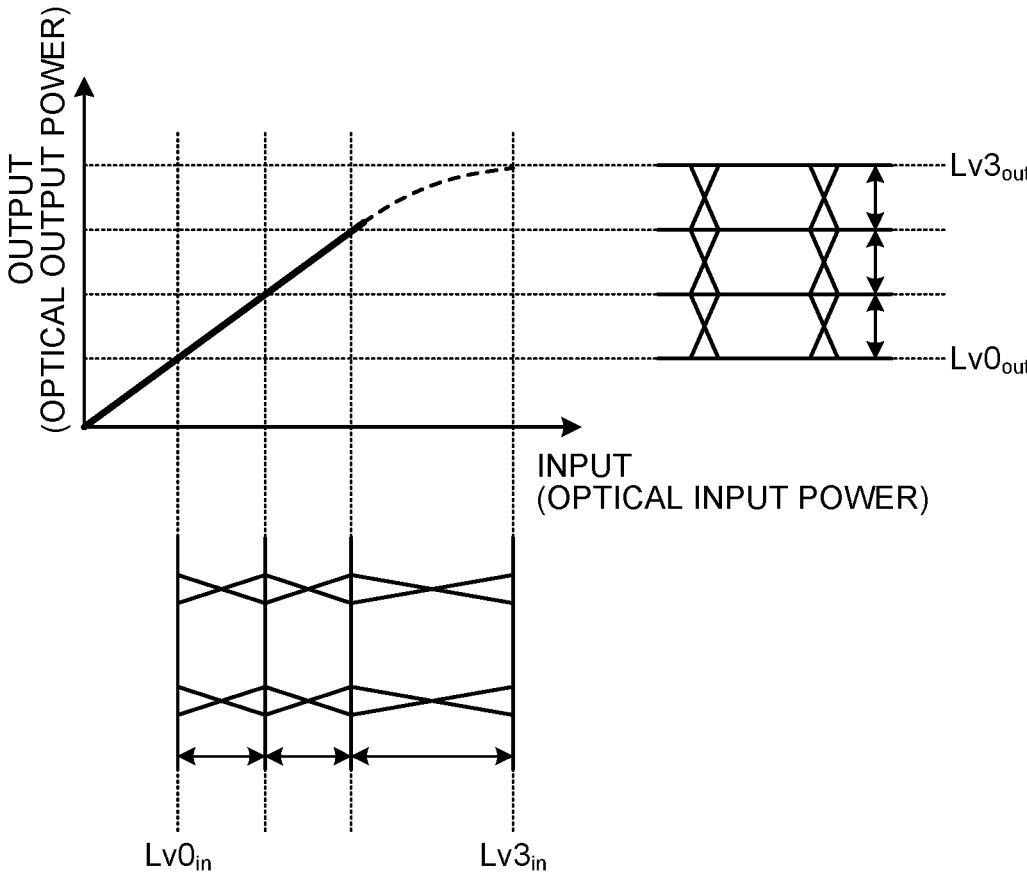
FIG. 14 is an explanatory diagram illustrating an example of the optical input-output characteristics of the SOA after non-linear distortion correction after power compensation.

FIG. 14 is an explanatory diagram illustrating an example of the optical input-output characteristics of the SOA after non-linear distortion correction after power compensation. After the controller 24 sets the setting value of the drive voltage corresponding to the calculated optical input power in the generator 11, while the amplitude ratios of the optical input power of the SOA 14 between the levels after power compensation are different, the amplitude ratios of the optical output power of the SOA 14 between the levels after power compensation after the optical amplification approximate equal amplitude ratios. As a result, it is possible to compensate the optical output waveform distortion due to the non-linear distortion of the SOA 14.

Figure 15:
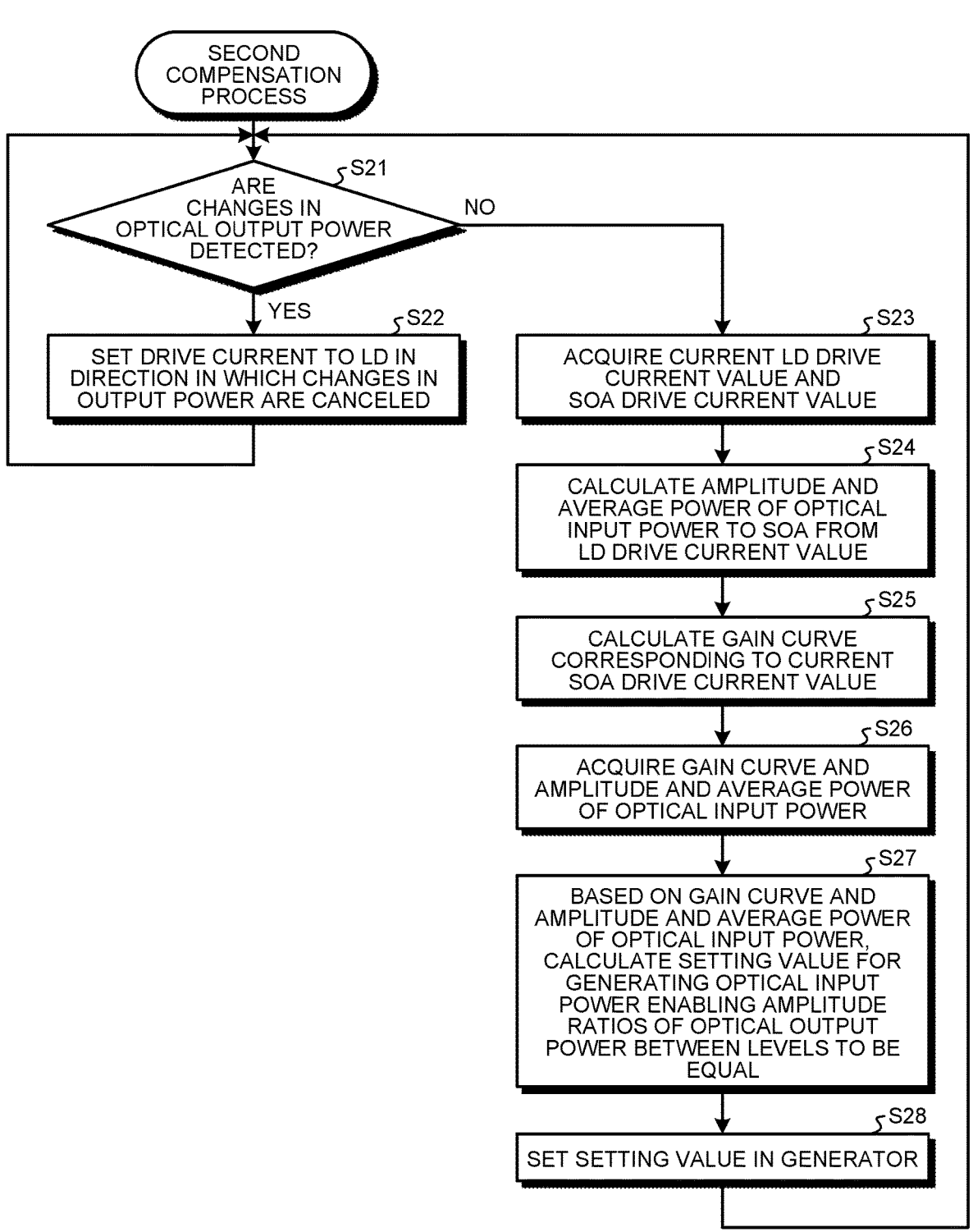
FIG. 15 is a flowchart illustrating an example of process operations performed by the optical transmitter that relate to a second compensation process.

FIG. 15 is a flowchart illustrating an example of process operations performed by the optical transmitter 1A that relate to a second compensation process. Note that the second compensation process that compensates the optical output waveform distortion due to the non-liner distortion of the SOA 14 is continuously executed during communication with an opposing optical receiver. The comparator 20 in the optical transmitter 1A determines whether changes in the optical output power are detected based on a difference signal of the comparator 20 (step S21). Note that the changes in the optical output power are changes in the optical output power including changes in optical coupling that relate to optical components between the SOA 14 and the optical fiber 2. When changes in the optical output power including changes in optical coupling are detected based on the difference signal of the comparator 20 (YES at step S21), the comparator 20 sets, in the changeable current source 32, a LD drive current to be supplied to the LD 12 in a direction in which the changes in the optical output power are canceled (step S22). As a result, the optical transmitter 1A is able to cancel the changes in the optical output power including changes in optical coupling by performing drive control on the LD12 according to the LD drive current to change the optical input power of the SOA 14.

After setting the LD drive current for canceling the changes in the optical output power, the comparator 20 moves to step S21 in order to determine whether changes in the optical output power are detected. When changes in the optical output power are not detected (NO at step S21), the controller 24A in the optical transmitter 1A acquires a current LD drive current value and a current SOA drive current value from the current monitor 33 (step S23). Note that the SOA drive current value is the fixed value.

The controller 24A calculates an amplitude and an average power of the optical input power of an optical signal to the SOA 14 from the acquired current LD drive current value (step S24). Furthermore, the controller 24A acquires a gain curve of the SOA 14 corresponding to the current SOA drive current value from the gain table 25A (step S25) and calculates the acquired gain curve, the amplitude of the optical input power of the SOA 14, and the average power of the optical input power (step S26).

Based on the gain curve of the SOA 14, the amplitude of the optical input power of the SOA 14, and the average power, the controller 24A calculates a setting value corresponding to a drive voltage for generating an optical input power such that the amplitude ratios of the optical output power between levels approximate equal amplitude ratios (step S27). Furthermore, the controller 24A sets the calculated setting value in the generator 11 (step S28) and returns to the process at step S21 in order to determine whether changes in the optical output power are detected. In other words, the generator 11 generates a drive voltage to be applied to the modulator 13 such that the amplitude ratios of the optical output power of an optical signal of the SOA 14 between levels approximate equal amplitude ratios. The modulator 13 optically modulates a laser light according to the drive voltage and outputs the optical signal to the SOA 14. The SOA 14 performs optical amplification according to the SOA drive current and outputs an optical output power in which amplitude ratios between the levels after the optical amplification approximate equal amplitude ratios. As a result, canceling the optical output waveform distortion resulting from non-linear distortion of the SOA 14 makes it possible to increase signal quality.

The optical transmitter 1A of the second embodiment acquires a gain curve of the SOA 14 corresponding to the LD drive current from the gain table 25A. Based on the acquired gain curve of the SOA 14, the optical transmitter 1A controls the generator 11 such that the generator 11 generates a drive voltage for approximating the amplitude ratios of the optical output power of the SOA 14 between the levels to equal amplitude ratios. As a result, by compensating the optical output waveform distortion resulting from the non-linear distortion of the SOA 14, the optical transmitter 1A increases the signal quality.

Based on the gain curve of the SOA 14 corresponding to the LD drive current, the amplitude of the optical input power of the SOA 14, and the average power of the SOA 14 at each level, the optical transmitter 1A controls the generator 11 such that the generator 11 generates a drive voltage for approximating the amplitude ratios between levels that are the respective levels of the optical output power of the SOA 14 to equal amplitude ratios. As a result, by compensating the optical output waveform distortion resulting from the non-linear distortion of the SOA 14, the optical transmitter 1A increases the signal quality.

Based on the current monitor value of the PD 18, the optical transmitter 1A adjusts the LD drive current to the LD 12. As a result, the optical transmitter 1A is able to cancel changes in the optical output power (optical output intensity) including changes in optical coupling.

The first compensation process and the second compensation process may be used together and an embodiment thereof will be described as a third embodiment below.

Third Embodiment

Figure 16:
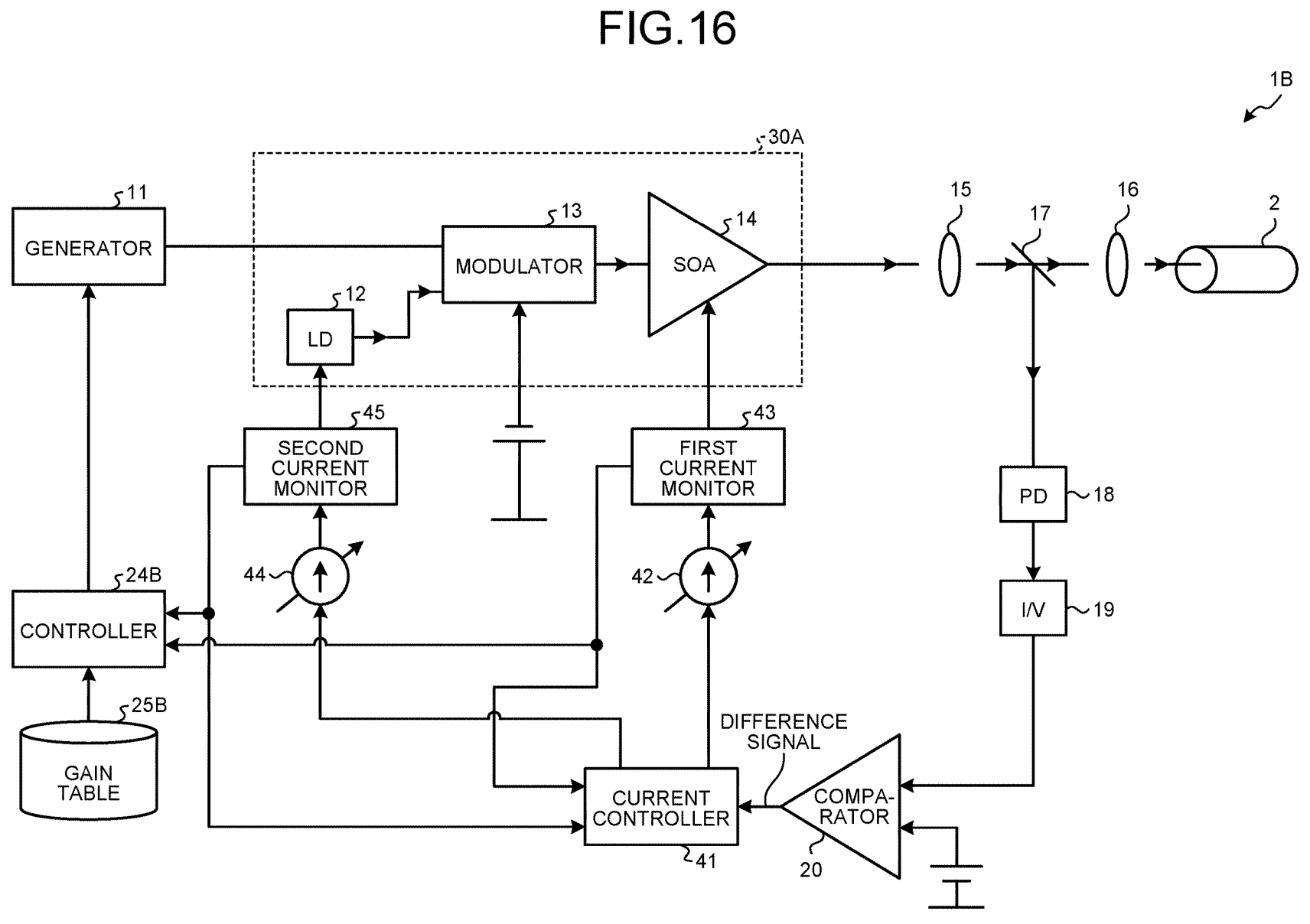

FIG. 16 is an explanatory diagram illustrating an example of a configuration of an optical transmitter 1B of a third embodiment. Note that the same components as those of the optical transmitter 1 (1A) of the first embodiment (the second embodiment) are denoted with the same reference numerals as those of the first (second) embodiment and thus redundant description of the components and operations will be omitted. The optical transmitter 1B illustrated in FIG. 16 switches between and executes the first compensation process and the second compensation process based on an amount of change in a LD power and an amount of change in a SOA power. The optical transmitter 1B illustrated in FIG. 16 includes the generator 11, the LD 12, the modulator 13, the SOA 14, the first lens 15, the second lens 16, the branching unit 17, the PD 18, the voltage converter 19, and the comparator 20. The optical transmitter 1B further includes a current controller 41, a first changeable current source 42, a first current monitor 43, a second changeable current source 44, a second current monitor 45, a controller 24B, and a gain table 25B.

The comparator 20 compares a monitor voltage value that is converted in the voltage converter 19 and a target voltage value and sets a difference signal that is the result of the comparison in the current controller 41. The first changeable current source 42 adjusts a SOA drive current to be supplied to the SOA 14 in a direction in which changes in the optical output power including changes in optical coupling at an output stage of the SOA 14 are canceled according to the difference signal. The first current monitor 43 monitors a SOA drive current value from the first changeable current source 42 and notifies the controller 24B and the current controller 41 of the SOA drive current value. The controller 24B calculates an amount of change in the SOA power according to the SOA drive current value. The amount of change in the SOA power is dealt with using a positive or negative sign and, when the sign is negative, the amount of change is dealt with as a decrease in power.

The second changeable current source 44 adjusts a LD drive current to be supplied to the LD 12. The second current monitor 45 monitors a LD drive current value from the second changeable current source 44 and notifies the controller 24B and the current controller 41 of the LD drive current value. The controller 24B calculates an amount of change in the LD power according to the LD drive current value. The amount of change in the LD power is dealt with using a positive or negative sign and, when the sign is negative, the amount of change is dealt with as a decrease in power.

When the amount of change in the LD power>the amount of change in the SOA power, the controller 24B executes the first compensation process of adjusting the SOA drive current value to be supplied to the SOA 14 and generating a drive voltage. In other words, when the amount of change in the LD power is higher than the amount of change in the SOA power, the first compensation process of adjusting the SOA drive current to the SOA 14 is executed.

When the amount of change in the LD power>the amount of change in the SOA power, the current controller 41 adjusts the SOA drive current value to be supplied to the SOA 14, thereby canceling changes in the optical output power including changes in optical coupling.

When the inequality, the amount of change in the LD power>the amount of change in the SOA power, is not met, the controller 24B executes the second compensation process of adjusting the LD drive current value to be supplied to the LD 12 and generating a drive voltage. In other words, when the amount of change in the SOA power is higher than the amount of change in the LD power, the second compensation process of adjusting the LD drive current to the LD 12 is executed.

When the inequality, the amount of change in the LD power>the amount of change in the SOA power, is not met, the current controller 41 adjusts the LD drive current value to be supplied to the LD 12, thereby canceling changes in the optical output power including changes in optical coupling.

Figure 17:
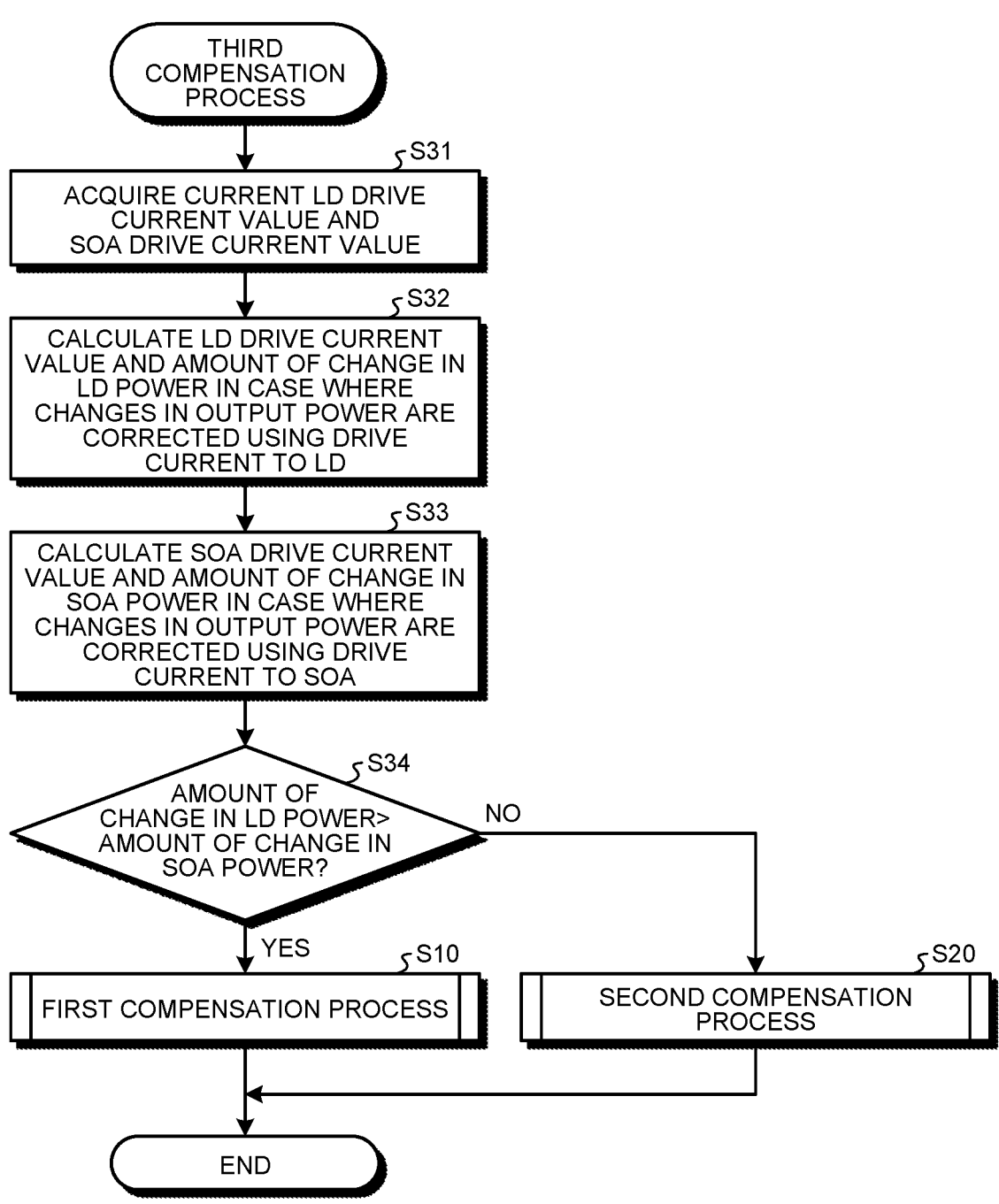
FIG. 17 is a flowchart illustrating an example of process operations performed by the optical transmitter that relate to a third compensation process.

FIG. 17 is a flowchart illustrating an example of process operations performed by the optical transmitter 1B that relate to a third compensation process. The controller 24B in the optical transmitter 1B in FIG. 17 acquires a current LD drive current value and a current SOA drive current value (step S31). The controller 24B calculates an LD drive current value and an amount of change in the LD power in the case where the changes in the optical output power are corrected using the LD drive current to be supplied to the LD 12 (step S32).

The controller 24B calculates an SOA drive current value and an amount of change in the SOA power in the case where the changes in the optical output power are corrected using the drive current to be supplied to the SOA 14 (step S33). The controller 24B determines whether the amount of change in the LD power>the amount of change in the SOA power (step S34).

When the amount of change in the LD power>the amount of change in the SOA power (YES at step S34), the controller 24B executes the first compensation process (step S10) and ends the process operations illustrated in FIG. 17.

When the inequality, the amount of change in the LD power>the amount of change in the SOA power, is not met (NO at step S34), the controller 24B executes the second compensation process (step S20) and ends the process operations illustrated in FIG. 17.

The optical transmitter 1B of the third embodiment acquires a gain curve of the SOA 14 corresponding to the LD drive current from the gain table 25. Based on the acquired gain curve, the optical transmitter 1B executes the second compensation process of controlling the generator 11 such that the generator 11 generates a drive voltage for approximating the amplitude ratios of the optical output power of the SOA 14 between the levels to equal amplitude ratios. The optical transmitter 1B acquires a gain curve of the SOA 14 corresponding to the SOA drive current from the gain table 25. Based on the acquired gain curve, the optical transmitter 1B executes the first compensation process of controlling the generator 11 such that the generator 11 generates a drive voltage for approximating the amplitude ratios of the optical output power of the SOA 14 between the levels to equal amplitude ratios. As a result, by compensating the optical output waveform distortion resulting from the non-linear distortion of the SOA 14 while using the first compensation process and the second compensation process in combination, the optical transmitter 1B increases the signal quality.

The optical transmitter 1B executes the first compensation process when the amount of change in the LD power corresponding to the LD drive current exceeds the amount of change in the SOA power corresponding to the SOA drive current and executes the second compensation process when the amount of change in the LD power dose not exceed the amount of change in the SOA power. As a result, by compensating the optical output waveform distortion resulting from the non-linear distortion of the SOA 14 while choosing a compensation process enabling a reduction in the amount of change in power from the processes on the LD 12 and the SOA 14, the signal quality is increased.

The optical transmitter 1B of the third embodiment exemplifies the case where the first compensation process and the second compensation process are switched and executed based on the amount of change in the LD power and the amount of change in the SOA power. The first compensation process and the second compensation process however may be switched and executed based on the SOA drive current value and an embodiment thereof will be described as a fourth embodiment below. The same components as those of the optical transmitter 1B of the third embodiment are denoted with the same reference numerals as those of the third embodiment and thus redundant description of the components and operations will be omitted.

Fourth Embodiment

When a current SOA drive current value<an upper limit of a SOA drive current, the controller 24B executes the first compensation process of adjusting the SOA drive current value to the SOA 14 and generating a drive voltage. Note that the upper limit of the SOA drive current is an upper limit of the drive current that drives the SOA 14 and is a value that is determined based on a maximum allowable current of a device and an allowable amount of shot noise.

When the inequality, the current SOA drive current value<the upper limit of the SOA drive current, is not met, the controller 24B executes the second compensation process of adjusting the LD drive current value to the LD 12 and generating a drive voltage. In other words, when the SOA drive current value is the upper limit, the drive current to the LD 12 is adjusted.

Figure 18:
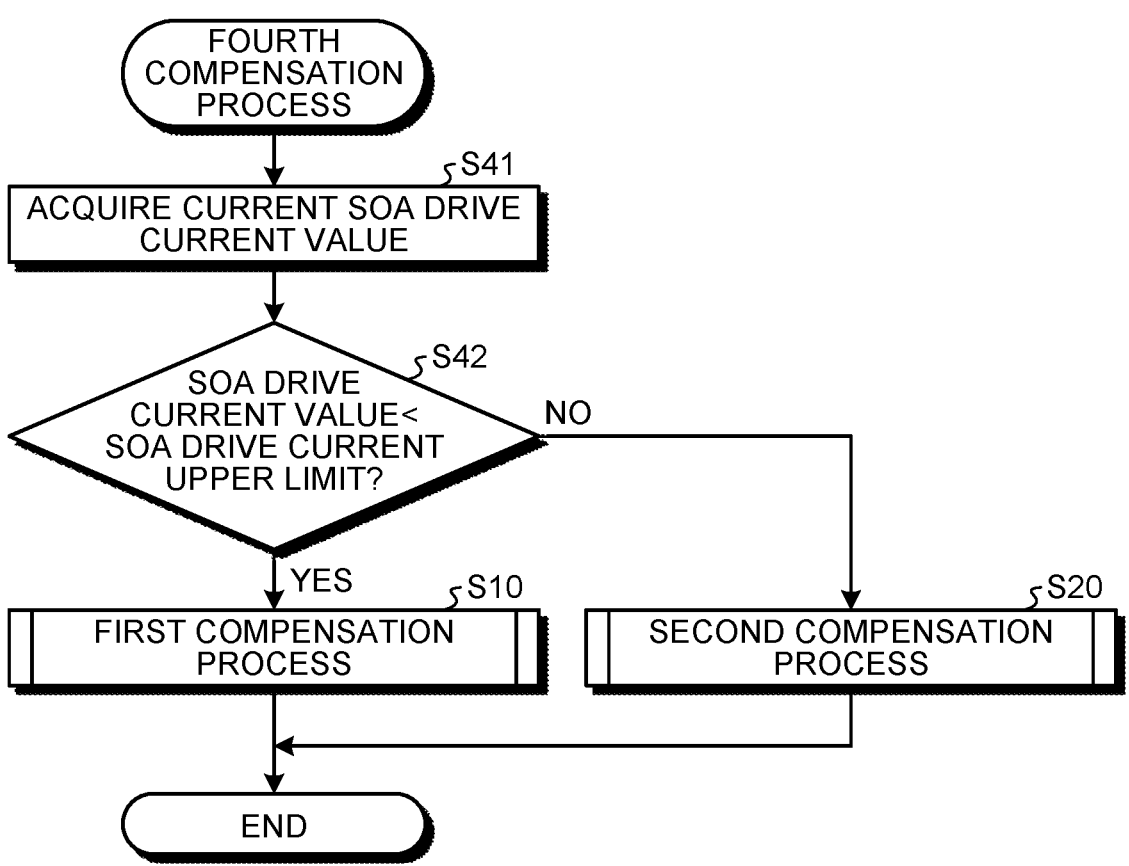
FIG. 18 is a flowchart illustrating an example of process operations performed by the optical transmitter that relate to a fourth compensation process.

FIG. 18 is a flowchart illustrating an example of process operations performed by an optical transmitter 1C that relate to the fourth compensation process. The controller 24B in the optical transmitter 1C acquires a current SOA drive current value (step S41). The controller 24B determines whether the current SOA drive current value<the upper limit of the SOA drive current (step S42).

When the current SOA drive current value<the upper limit of the SOA drive current (YES at step S42), the controller 24B executes the first compensation process (step S10) and ends the process operations illustrated in FIG. 18.

When the inequality, the current SOA drive current value<the upper limit of the SOA drive current, is not met (NO at step S42), the controller 24B determines that the SOA drive current value exceeds the upper limit and executes the second compensation process (step S20) and ends the process operations illustrated in FIG. 18.

The optical transmitter 1C of the fourth embodiment executes the first compensation process when the SOA drive current is under the upper limit and executes the second compensation process when the SOA drive current is at or above the upper limit. As a result, by compensating the optical output waveform distortion resulting from non-linear distortion of the SOA 14 while determining whether the SOA drive current value is the upper limit, the signal quality is increased. Furthermore, the compensation process with higher amplification efficiency is used.

The PAM4 is exemplified as the signal according to the multilevel amplitude modulation method for convenience of description; however, needless to say, the signal is not limited to PAM 4 and, for example, PAM 6, PAM 8, etc., are usable.

Incorporating a APD or an SOA enables even an optical receiver that receives an optical signal from the optical transmitter 1 of the embodiment to further meet the requirements of loss budget in long-distance transfer. The optical transmitter 1 exemplifies the case where the LD 12, the modulator 13, and the SOA 14 are configured using the single chip 30A has been exemplified; however the single chip need not necessarily be used and a change may be made as appropriate.

According to one aspect, signal quality is increased by making an improvement on changes in an optical output power.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical device comprising:

a generator that generates an electric signal of a multilevel amplitude modulation method;

a light emitter that emits laser light;

a modulator that modulates the laser light using the electric signal and outputs an optical signal of the modulated laser light;

an optical amplifier that optically amplifies the modulated optical signal according to a drive current;

a current source that adjusts the drive current to be supplied to the optical amplifier;

a storage that previously stores an information with respect to input-output characteristics of the optical signal in the optical amplifier relative to drive current value of the drive current; and a controller that acquires, from the storage, the input-output characteristics corresponding to the drive current value of the drive current supplied to the optical amplifier and controls the electric signal based on the acquired input-output characteristics.

2. The optical device according to claim 1, wherein the controller controls the generator such that, based on the input-output characteristics corresponding to the drive current value, an amplitude of an input signal of the optical amplifier, and an average power of the input signal of the optical amplifier at each level, the generator generates the electric signal that approximates amplitude ratios of an output signal of the optical amplifier between levels at each level of the multilevel amplitude modulation method to equal amplitude ratios.

3. The optical device according to claim 2, further including:

a branching unit that branches part of the optical signal after being optically amplified by the optical amplifier; and a monitor that monitors part of the branched optical signal, wherein the current source adjusts the drive current to be supplied to the optical amplifier such that a monitor value of the monitor is a target value.

4. An optical device comprising:

a generator that generates an electric signal of a multilevel amplitude modulation method;

a light emitter that emits laser light according to a first drive current;

a modulator that modulates the laser light using the electric signal and outputs an optical signal of the modulated laser light;

an optical amplifier that optically amplifies the modulated optical signal according to a second drive current;

a first current source that adjusts the first drive current to be supplied to the light emitter;

a second current source that adjusts the second drive current to be supplied to the optical amplifier;

a storage that previously stores a first information with respect to input-output characteristics of the optical signal in the optical amplifier relative to drive current value of the first drive current; and a controller that acquires, from the storage, the input-output characteristics corresponding to the drive current value of the first drive current and controls the electric signal based on the acquired input-output characteristics.

5. The optical device according to claim 4, wherein the controller controls the generator such that, based on the input-output characteristics corresponding to the drive current value of the first drive current, an amplitude of an input signal of the optical amplifier, and an average power of the input signal of the optical amplifier at each level, the generator generates the electric signal that approximates amplitude ratios of an output signal of the optical amplifier between levels at each level of the multilevel amplitude modulation method to equal amplitude ratios.

6. The optical device according to claim 5, further including:

a branching unit that branches part of the optical signal after being optically amplified by the optical amplifier; and a monitor that monitors part of the branched optical signal, wherein the first current source adjusts the first drive current to be supplied to the light emitter such that a monitor value of the monitor is a target value.

7. The optical device according to claim 4, further including a storage that previously stores the first information with respect to the input-output characteristics of the optical signal in the optical amplifier relative to drive current value of the first drive current and that previously stores a second information with respect to input-output characteristics of the optical signal in the optical amplifier relative to drive current value of the second drive current, wherein the controller executes any one of a second compensation process of acquiring the input-output characteristics corresponding to the drive current value of the first drive current from the storage and, based on the acquired input-output characteristics, controlling the generator such that the generator generates the electric signal that approximates amplitude ratios of an output signal of the optical amplifier between levels at each level to equal amplitude ratios and a first compensation process of acquiring the input-output characteristics corresponding to the drive current value of the second drive current from the storage and, based on the acquired input-output characteristics, controlling the generator such that the generator generates the electric signal that approximates amplitude ratios of an output signal of the optical amplifier between levels at each level to equal amplitude ratios.

8. The optical device according to claim 7, wherein the controller executes the first compensation process when an amount of change in a first power corresponding to the first drive current supplied to the light emitter exceeds an amount of change in a second power corresponding to the second drive current supplied to the optical amplifier and executes the second compensation process when the amount of change in the first power is equal to or smaller than the amount of change in the second power.

9. The optical device according to claim 7, wherein the controller executes the first compensation process when the second drive current supplied to the optical amplifier is smaller than an upper limit and executes the second compensation process when the second drive current is equal to or larger than the upper limit.

10. An optical transmitter that transmits an optical signal, the optical transmitter comprising:

a generator that generates an electric signal of a multilevel amplitude modulation method;

a light emitter that emits laser light according to a first drive current;

a modulator that modulates the laser light using the electric signal and outputs an optical signal of the modulated laser light;

an optical amplifier that optically amplifies the modulated optical signal according to a second drive current;

a first current source that adjusts the first drive current to be supplied the light emitter;

a second current source that adjusts the second drive current to be supplied the optical amplifier;

a storage that previously stores a first information with respect to input-output characteristics of the optical signal in the optical amplifier relative to drive current value of the first drive current and/or a second information with respect to input-output characteristics of the optical signal in the optical amplifier relative to drive current value of the second drive current; and a controller that acquires, from the storage, the input-output characteristics corresponding to the drive current value of the first drive current and/or the drive current value of the second drive current and controls the electric signal based on the acquired input-output characteristics.

\* \* \* \* \*